United States Patent
Fukuda et al.

(10) Patent No.: US 8,649,410 B2
(45) Date of Patent: Feb. 11, 2014

(54) SEMICONDUCTOR LASER AND METHOD FOR MANUFACTURING THE SAME

(75) Inventors: Chie Fukuda, Yokohama (JP); Takashi Kato, Yokohama (JP)

(73) Assignee: Sumitomo Electric Industries Ltd, Osaka (JP)

( * ) Notice: Subject to any disclaimer, the term of this patent is extended or adjusted under 35 U.S.C. 154(b) by 362 days.

(21) Appl. No.: 12/779,272

(22) Filed: May 13, 2010

(65) Prior Publication Data
US 2010/0296539 A1   Nov. 25, 2010

(30) Foreign Application Priority Data

May 21, 2009   (JP) ................. 2009-123341

(51) Int. Cl.
*H01S 5/00* (2006.01)
(52) U.S. Cl.
USPC ...................................... 372/50.11
(58) Field of Classification Search
None
See application file for complete search history.

(56) References Cited

U.S. PATENT DOCUMENTS

| | | | |
|---|---|---|---|
| 4,896,325 A | 1/1990 | Coldren | |
| 6,690,688 B2 * | 2/2004 | Gotoda | 372/20 |
| 6,909,734 B2 * | 6/2005 | Coldren et al. | 372/46.01 |
| 7,145,923 B2 * | 12/2006 | Carter et al. | 372/20 |
| 7,257,137 B2 * | 8/2007 | Robbins et al. | 372/20 |
| 7,366,220 B2 * | 4/2008 | Takabayashi | 372/20 |

\* cited by examiner

*Primary Examiner* — Armando Rodriguez
*Assistant Examiner* — Sean Hagan
(74) *Attorney, Agent, or Firm* — Smith, Gambrell & Russell, LLP

(57) ABSTRACT

A semiconductor laser according to the present invention includes a first reflective region and a second reflective region disposed opposite to the first reflective region in a predetermined direction of an optical axis. The first reflective region has a plurality of gain waveguides each including an active layer and a plurality of refractive-index controlling waveguides each having a first diffraction grating formed therein. The gain waveguides and the refractive-index controlling waveguides are alternately arranged at a predetermined pitch in the direction of the optical axis. The second reflective region has a second diffraction grating.

15 Claims, 15 Drawing Sheets

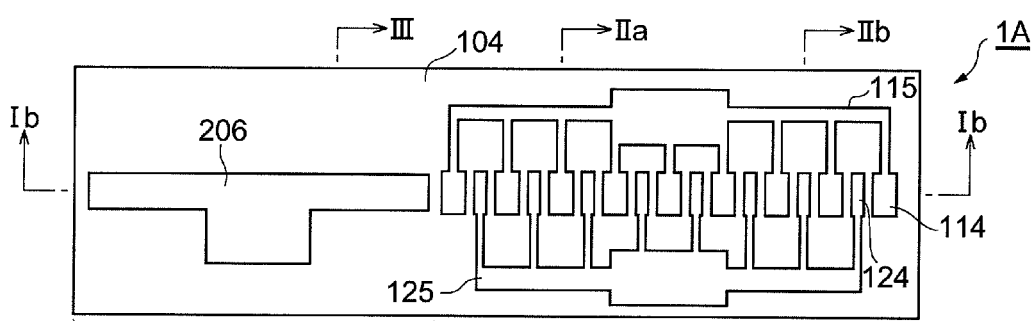
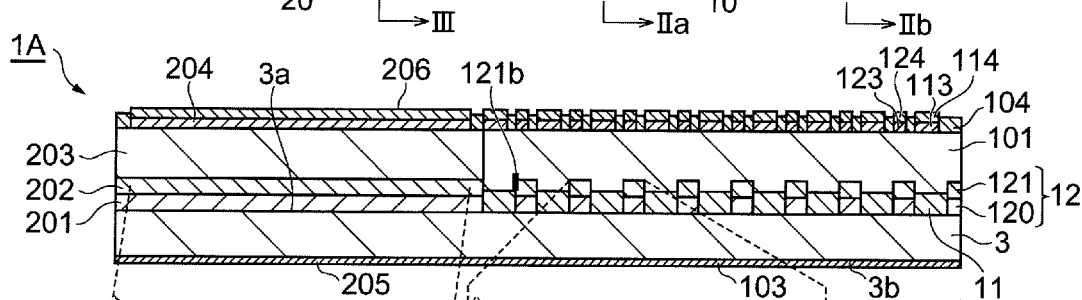
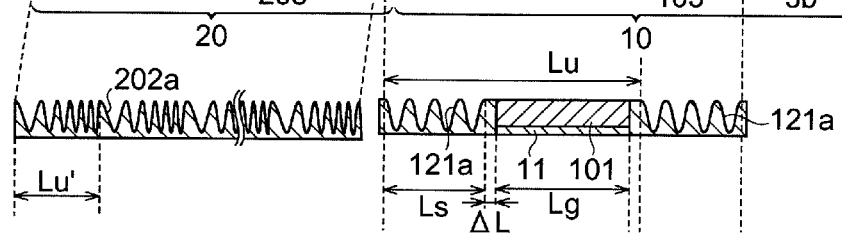

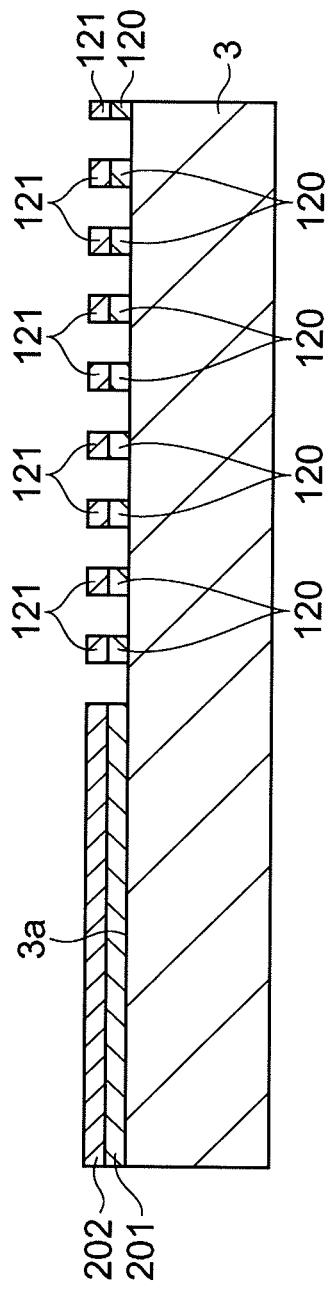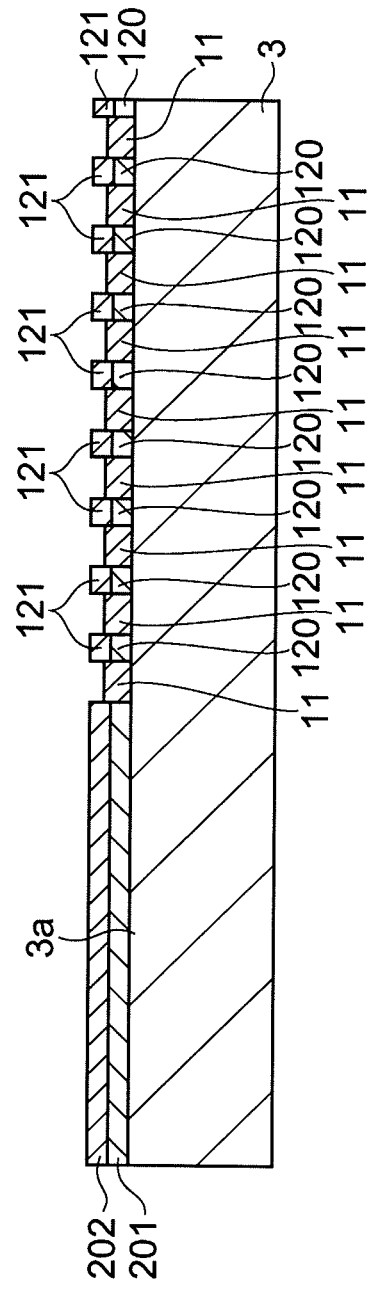

PRIOR ART

SEMICONDUCTOR LASER AND METHOD FOR MANUFACTURING THE SAME

BACKGROUND OF THE INVENTION

1. Field of the Invention

The present invention relates to semiconductor lasers and methods for manufacturing the same.

2. Description of the Related Art

In the field of optical communication systems in recent years, the amount of transmitting information is drastically increasing. In order to respond to the increase in the amount of transmitting information, wavelength-division multiplexing (WDM) systems have been constructed. In WDM systems, optical signals with different wavelengths are transmitted through a single optical waveguide such as an optical fiber. In WDM systems, a plurality of semiconductor lasers with different lasing wavelengths are conventionally used as light sources. The lasing wavelengths of these semiconductor lasers are fixed in the conventional WDM systems. A more efficient communication system can be constructed by making the wavelengths of the semiconductor lasers tunable. High performances such as high wavelength stability, a wide wavelength tunable range, compactness, low power consumption, and high-speed operation are required for wavelength tunable semiconductor lasers.

For example, U.S. Pat. No. 4,896,325 discloses a wavelength tunable semiconductor laser with DBR regions including sampled gratings (SGs). A sampled grating has a periodic structure in which a segment of a grating is periodically separated by a blank space at a sampling period. FIG. 15 is a schematic cross-sectional view showing the configuration of a semiconductor laser 100 discussed in U.S. Pat. No. 4,896, 325. The semiconductor laser 100 includes four regions provided on a single semiconductor substrate, namely, a gain region 151, a phase control region 152, and distributed Bragg reflector (DBR) regions 153 and 154. In this semiconductor laser 100, optical light with a relatively broad wavelength band is generated at an active layer 161 in the gain region 151 and a light with a specific wavelength is selectively emitted.

The DBR regions 153 and 154 respectively include sampled gratings (SGs) 163 and 164 and each have a reflection spectrum having a plurality of reflectivity peaks at a fixed wavelength interval. Moreover, the interval between the reflectivity peaks in the SG 163 is different from the interval between the reflectivity peaks in the SG 164. Laser oscillation is achieved at a wavelength where the reflectivity peak of the SG 163 overlaps with the reflectivity peak of the SG 164. For an SG, the wavelength of the reflectivity peaks is determined on the basis of a grating period, and the wavelength interval between the reflectivity peaks is determined on the basis of the sampling period of SG.

By injecting current into the DBR regions 153 and 154, the refractive indices of the SGs 163 and 164 can be changed. As a result, the wavelengths at the reflectivity peaks are shifted, thereby controlling the lasing wavelength by utilizing a so-called vernier effect. The phase control region 152 controls the phase of light guiding through the optical waveguide 162 in the phase control region 152 so as to perform fine adjustment on the lasing wavelength. In the semiconductor laser 100 having the above configuration, the refractive indices of the SGs 163 and 164 and a waveguide 162 are appropriately adjusted by current injection, thereby allowing for a continuous change in the lasing wavelength.

SUMMARY OF THE INVENTION

In the semiconductor laser of the related art that utilizes a vernier effect by two DBR regions, it is necessary to perform wavelength control of the reflectivity peaks in the two DBR regions simultaneously with control of the phase shift amount in the phase control region in order to adjust the lasing wavelength. This extremely complicates the control of current supplied to the respective regions and slows down the operating speed for switching wavelengths.

In contrast, a semiconductor laser according to the present invention includes a first reflective region and a second reflective region disposed opposite to the first reflective region in a predetermined direction of an optical axis. The first reflective region has a plurality of gain waveguides each including an active layer and a plurality of refractive-index controlling waveguides each having a first diffraction grating formed therein. The gain waveguides and the refractive-index controlling waveguides are alternately arranged at a predetermined pitch in the direction of the optical axis. Moreover, the second reflective region has a second diffraction grating.

In the aforementioned semiconductor laser, the first reflective region may have a plurality of wavelengths at the reflectivity peaks (referred to as "reflectivity peak wavelength" hereinafter) that periodically vary at a first wavelength interval, and the second reflective region may have a plurality of reflectivity peak wavelengths that periodically vary at a second wavelength interval different from the first wavelength interval.

In this semiconductor laser, the refractive-index controlling waveguides having the first diffraction gratings formed therein and the gain waveguides including the active layers are alternately arranged at a predetermined pitch in the direction of the optical axis so that the entire first reflective region has an SG. Therefore, a reflection spectrum of the first reflective region has a plurality of reflectivity peak wavelengths that periodically vary at the first wavelength interval. On the other hand, the second reflective region has the second diffraction grating. In consequence, the second reflective region has a plurality of reflectivity peak wavelengths that periodically vary at the second wavelength interval different from the first wavelength interval. The first reflective region and the second reflective region constitute a laser cavity. When the wavelength of the reflectivity peaks of the first reflective region and the wavelength of the reflectivity peaks in a reflection spectrum of the second diffraction grating formed in the second reflective region overlap, lasing occurs at this overlapping wavelength.

Furthermore, in the aforementioned semiconductor laser, it is preferable that the first diffraction gratings respectively formed in the refractive-index controlling waveguides be the same and have a fixed period in the direction of the optical axis.

Furthermore, in the first reflective region of the aforementioned semiconductor laser, the first diffraction gratings may be formed only in the refractive-index controlling waveguides but not in the gain waveguides.

Furthermore, in the aforementioned semiconductor laser, the first reflective region may further have a gain electrode for injecting current into the gain waveguides, and a refractive-index controlling electrode for injecting current into the refractive-index controlling waveguides independently of the gain waveguides.

In this semiconductor laser, the reflectivity peak wavelengths in the first reflective region can be changed by injecting current into the refractive-index controlling waveguides via the refractive-index controlling electrode. In consequence, the lasing wavelength of the semiconductor laser can be readily changed.

Furthermore, in the aforementioned semiconductor laser, it is preferable that the first reflective region may further have a gain wiring pattern that interconnects the gain waveguides, and a refractive-index-controlling wiring pattern that interconnects the refractive-index controlling waveguides.

Furthermore, in the aforementioned semiconductor laser, the second diffraction grating formed in the second reflective region preferably includes a super-structure grating. Accordingly, a plurality of reflectivity peak wavelengths that periodically vary at the predetermined second wavelength interval can be provided. Furthermore, the super-structure grating in the second reflective region may have a plurality of unit structures periodically disposed in the direction of the optical axis. The unit structure may include a chirped diffraction grating.

Furthermore, in the aforementioned semiconductor laser, it is preferable that the second reflective region may further have a refractive-index controlling layer and an electrode for injecting current into the refractive-index controlling layer, and that the second diffraction grating may be provided along the refractive-index controlling layer.

In this semiconductor laser, the wavelength of the reflectivity peaks in the reflection spectrum of the second diffraction grating can be changed in accordance with the magnitude of current injected into the refractive-index controlling layer in the second reflective region. In consequence, the lasing wavelength of the semiconductor laser can be readily changed. In particular, by adjusting the amounts of current to be injected into the refractive-index controlling waveguides in the first reflective region and the refractive-index controlling layer formed in the second reflective region, the reflectivity peaks of the first and second diffraction gratings can be shifted continuously towards the shorter wavelength side while the peak wavelengths are in an overlapped state. Thus, the lasing wavelength can be changed continuously towards the shorter wavelength side.

Furthermore, in the aforementioned semiconductor laser, a band gap wavelength of the refractive-index controlling waveguides is preferably shorter than a band gap wavelength of the gain waveguides.

Furthermore, in the aforementioned semiconductor laser, any one of the first diffraction gratings respectively formed in the refractive-index controlling waveguides may include a phase shift region.

Furthermore, in the aforementioned semiconductor laser, a coupling coefficient of each first diffraction grating is preferably greater than a coupling coefficient of the second diffraction grating.

Preferably, the semiconductor laser may further include a phase control region provided between the first reflective region and the second reflective region. Moreover, the phase control region may further have an optical waveguide and an electrode for injecting current into the optical waveguide. The optical waveguide is not provided with a diffraction grating.

BRIEF DESCRIPTION OF THE DRAWINGS

FIG. 1A is a plan view of a semiconductor laser according to a first embodiment, FIG. 1B is a cross-sectional view of the semiconductor laser taken along line Ib-Ib in FIG. 1A, and FIG. 1C schematically illustrates diffraction gratings included in diffraction grating layers shown in FIG. 1B;

FIG. 8A illustrates a cross-sectional view showing the process subsequent to the process of FIG. 7B, and FIG. 8B illustrates a cross-sectional view showing the process subsequent to the process of FIG. 8A;

DESCRIPTION OF THE PREFERRED EMBODIMENTS

Figure 2A:
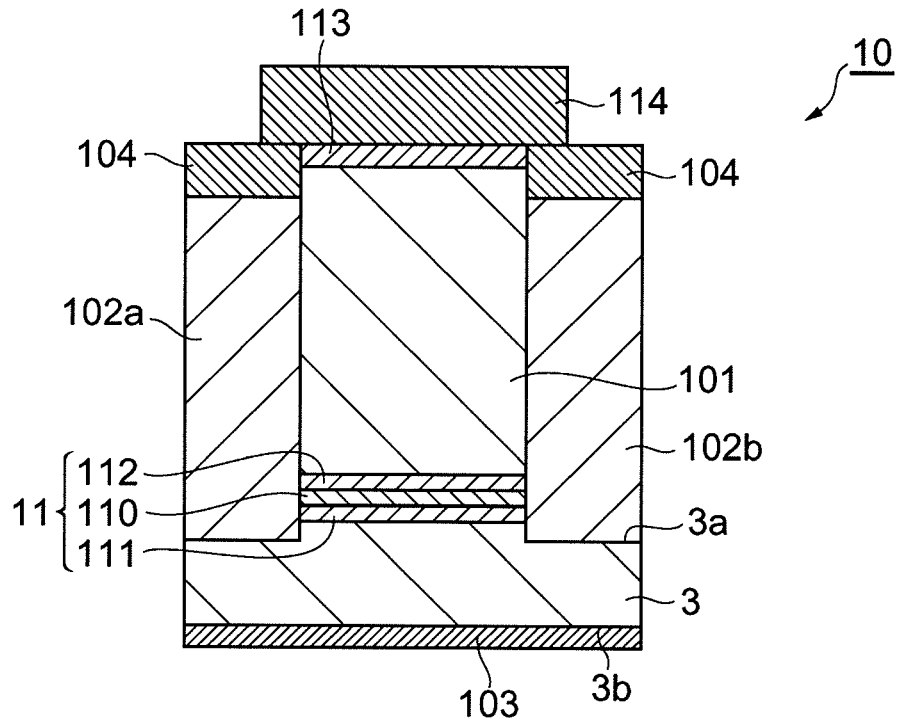
FIG. 2A is a cross-sectional view of the semiconductor laser taken along line IIa-IIa in FIG. 1A.

Embodiments of a semiconductor laser according to the present invention will be described in detail below with reference to the attached drawings. In the drawings, the same components are given the same reference numerals, and redundant descriptions thereof will be omitted.

First Embodiment

A semiconductor laser 1A according to a first embodiment is a tunable semiconductor laser that is capable of changing the lasing wavelength. Referring to FIGS. 1A and 1B, the semiconductor laser 1A according to this embodiment includes a distributed feedback (DFB) region 10 and a distributed Bragg reflector (DBR) region 20. The DFB region 10 corresponds to a first reflective region according to this embodiment and is configured to amplify and reflect light with a specific wavelength. The DBR region 20 corresponds to a second reflective region according to this embodiment and is configured to reflect the light propagating from the DFB region 10. The first reflective region and the second reflective region constitute a laser cavity. In this embodiment, the DFB region 10 and the DBR region 20 constitute a laser cavity of the semiconductor laser 1A. As shown in FIG. 1B, the DFB region 10 and the DBR region 20 are formed on a common semiconductor substrate 3 and are arranged in a light guiding direction that is a predetermined direction of an optical axis. The semiconductor substrate 3 is composed of a semiconductor of a first conductivity type, such as n-type InP, and serves as a lower cladding layer for optical waveguides in the DFB region 10 and the DBR region 20.

First, the configuration of the DFB region 10 will be described with reference to FIGS. 1A to 2B. As shown in FIG. 1B, the DFB region 10 in this embodiment includes a plurality of gain waveguides 11 and a plurality of refractive-index controlling waveguides 12. The gain waveguides 11 and the refractive-index controlling waveguides 12 are alternately arranged at a predetermined pitch in the light guiding direction.

As shown in FIG. 2A, each gain waveguide 11 has an active layer 110 and optical confinement layers 111 and 112 provided above and below the active layer 110. The active layer 110 has, for example, a multi-quantum well (MQW) structure including a plurality of well layers and barrier layers alternately stacked one on top of the other. The active layer 110 is configured to generate light by current injection. The well layers and the barrier layers constituting the quantum well structure are composed of GaInAsP with different compositions. Alternatively, the quantum well structure may be a strained quantum well structure in which the well layers are compressively strained. The amount of strain in the well layers in the strained quantum well structure is, for example, 1%. The overall thickness of the multi-quantum well structure is, for example, 115 nm, and a wavelength corresponding to band gap energy thereof (referred to as "band gap wavelength" hereinafter) is, for example, 1.55 μm. It is noted that the band gap wavelength λg exhibits emission wavelength due to interband transition determined by band gap energy Eg of semiconductor. The band gap wavelength λg and the band gap energy Eg have the following relation. λg=1.24/Eg.

The optical confinement layers 111 and 112 are composed of, for example, undoped GaInAsP. The band gap wavelength of each of the optical confinement layers 111 and 112 is shorter than the band gap wavelength of the active layer 110 and is, for example, 1.15 μm. The optical confinement layers 111 and 112 each have a thickness of, for example, 100 nm.

Figure 2B:
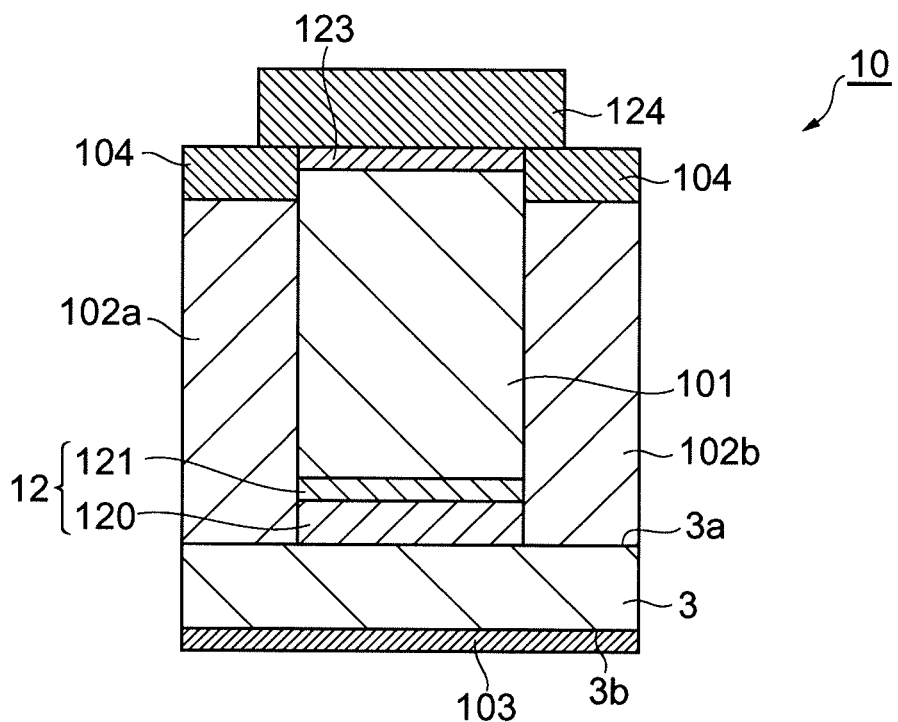
FIG. 2B is a cross-sectional view of the semiconductor laser taken along line IIb-IIb in FIG. 1A.
Figure 3:
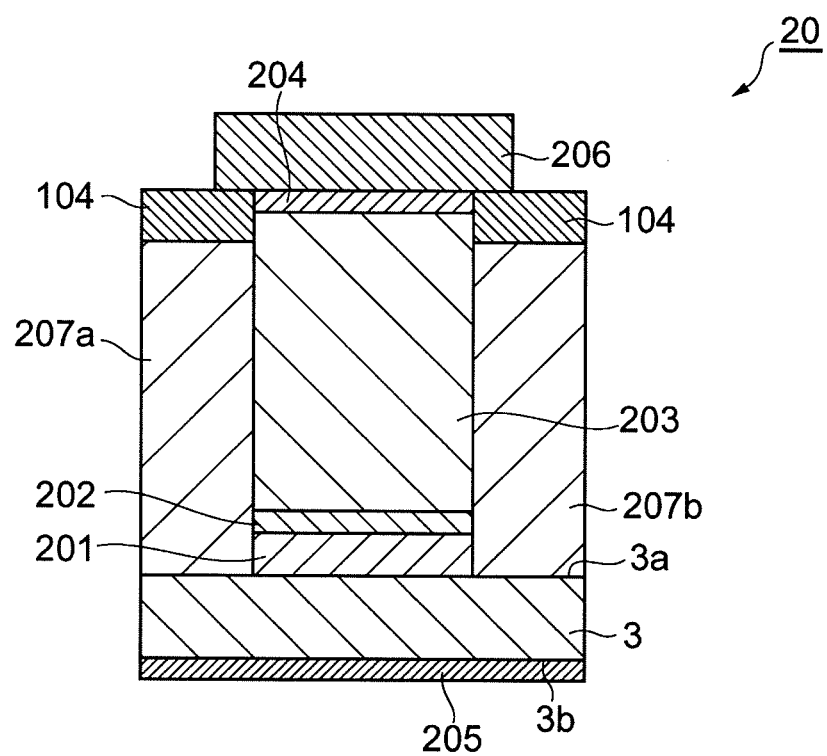
FIG. 3 is a cross-sectional view of the semiconductor laser taken along line III-III in FIG. 1A.

As shown in FIG. 2B, each refractive-index controlling waveguide 12 has an optical waveguide layer 120 and a diffraction grating layer 121 provided on the optical waveguide layer 120. The optical waveguide layer 120 is provided on a principal surface 3a of the semiconductor substrate 3 and is composed of, for example, undoped GaInAsP. The band gap wavelength of the optical waveguide layer 120 is shorter than the band gap wavelength of the active layer 110 in the DFB region 10 and is, for example, 1.3 p.m. The optical waveguide layer 120 has a thickness of, for example, 300 nm. The refractive index of the optical waveguide layer 120 changes in accordance with the magnitude of current injected into the optical waveguide layer 120 via a cathode electrode 103 and an anode electrode 124, to be described later.

The diffraction grating layer 121 is provided along the optical waveguide layer 120. In this embodiment, the diffraction grating layer 121 is provided directly on the optical waveguide layer 120. The diffraction grating layer 121 has a thickness of, for example, 50 nm. In order to effectively confine light to the optical waveguide layer 120, the band gap wavelength of the diffraction grating layer 121 is preferably shorter than the band gap wavelength of the optical waveguide layer 120, and is, for example, 1.2 p.m.

The diffraction grating layer 121 is formed of a double-layered structure including, for example, a p-type GaInAsP layer and a p-type InP layer formed on this p-type GaInAsP layer. The p-type GaInAsP layer has a first diffraction grating 121a (see FIG. 1C) on a surface thereof, and the p-type InP layer is embedded in periodic projections and recesses of the first diffraction grating 121a. The diffraction grating 121a is provided in each of the refractive-index controlling waveguides 12. Furthermore, the diffraction gratings 121a of the respective refractive-index controlling waveguides 12 are arranged in the light guiding direction at an interval defined by the gain waveguides 11. The grating period of the diffraction gratings 121a is fixed over the plurality of refractive-index controlling waveguides 12. It is to be noted that the diffraction gratings 121a are formed only in the refractive-index controlling waveguides 12 but not in the gain waveguides 11.

According to this configuration, the DFB region 10 has sampled gratings (SGs). A reflection spectrum of the DFB region 10 has a plurality of reflectivity peak wavelengths. The reflectivity peak wavelengths are spaced apart from each other by a predetermined wavelength interval (first wavelength interval according to this embodiment). The refractive index of the optical waveguide layer 120 changes in accordance with the magnitude of current injected therein via the cathode electrode 103 and the anode electrode 124. As a result, the reflectivity peak wavelengths of the DFB region 10 can be shifted.

The grating period of the diffraction gratings 121a is set to a value for obtaining a desired diffraction wavelength (e.g., 1550 nm). An SG unit length Lu (see FIG. 1C) is constituted by one gain waveguide 11 including the active layer 110 and one refractive-index controlling waveguide 12 including the diffraction grating 121a. A length Ls (see FIG. 1C) denotes the length of each diffraction grating section. The SG unit length Lu, the length Ls, and a unit number M of the SGs in the entire DFB region 10 are set so that a desired reflectivity peak wavelength interval and a desired peak reflectivity can be obtained. These values are set so that, for example, a reflectivity-peak wavelength interval is 5.6 nm and a peak reflectivity at the peak wavelength of 1550 nm is equal to 50%.

A distance ΔL (see FIG. 1C) between an interface between each gain waveguide 11 and its neighboring refractive-index controlling waveguide 12 and an edge of the corresponding diffraction grating 121a preferably ranges between 2 μm and 10 μm. Although the gain waveguides 11 and the refractive-index controlling waveguides 12 are separately formed during the manufacturing process of the semiconductor laser 1A, to be described later, irregularities in the interfaces between the gain waveguides 11 and the refractive-index controlling waveguides 12 can be prevented from spreading to the diffraction gratings 121a by setting the distance ΔL to 2 μm or larger. Furthermore, by setting the distance ΔL to 10 μm or smaller, the gain waveguides 11 can be given a sufficient length, thereby increasing the output power of laser.

The following equation (1) stands:

$$ng \times Lg + nb \times (Lu - Ls - Lg) = nb \times Lb \qquad (1)$$

where (Lu−Ls) denotes the distance between edges of neighboring diffraction gratings 121a, Lg denotes the length of each gain waveguide 11, nb denotes an effective refractive index of the refractive-index controlling waveguides 12, ng denotes an effective refractive index of the gain waveguides 11, and Lb denotes the distance between edges of the diffraction gratings 121a supposing that the diffraction gratings 121a are entirely formed over the refractive-index controlling waveguides 12. As specific numerical values, for example, Ls=12 µm, Lb=47 µm, and Lg=43 µm.

The diffraction gratings 121a in the diffraction grating layers 121 include a phase shift region 121b. The phase shift region 121b is a region where the phase of the diffraction gratings 121a is shifted by a predetermined distance. For example, amount of phase shift may be a $\lambda/4$ where the phase of the diffraction grating 121a is shifted by ¼ of the grating period. By providing this phase shift region 121b, the phases of light propagating through the DFB region 10 having the SGs can be adjusted by injecting current into the refractive-index controlling waveguides 12. The phase shift region 121b may be provided at only one location of all the refractive-index controlling waveguides 12.

At the interface between each gain waveguide 11 and its neighboring refractive-index controlling waveguide 12, a center position of the corresponding active layer 110 in a direction orthogonal to the principal surface 3a of the semiconductor substrate 3 and a center position of the corresponding optical waveguide layer 120 in the same direction have a relationship defined as follows. Specifically, the positional relationship between the two is defined so that an overlap integral between optical power distribution of light optically guided through the refractive-index controlling waveguide 12 in a fundamental transverse mode and optical power distribution of light optically guided through the gain waveguide 11 in a fundamental transverse mode is at maximum. In consequence, an optical coupling efficiency between the gain waveguide 11 and the refractive-index controlling waveguide 12 can be increased.

Referring to FIG. 1B and FIGS. 2A and 2B, the DFB region 10 further includes a cladding layer 101 and contact layers 113 and 123. The cladding layer 101 is provided on the optical confinement layers 112 and the diffraction grating layers 121 mentioned above. The cladding layer 101 is composed of a semiconductor of a second conductivity type, such as p-type InP. The band gap wavelength of the cladding layer 101 is shorter than the band gap wavelengths of the optical confinement layers 112 and the diffraction grating layers 121.

As shown in FIG. 1B, the contact layers 113 are provided on parts of the cladding layer 101 that correspond to the gain waveguides 11. On the other hand, the contact layers 123 are provided on parts of the cladding layer 101 that correspond to the refractive-index controlling waveguides 12. The contact layers 113 and 123 are composed of a semiconductor of a second conductivity type, such as p-type InGaAs.

As shown in FIGS. 2A and 2B, each gain waveguide 11 (including the active layer 110 and the optical confinement layers 111 and 112), each refractive-index controlling waveguide 12 (including the optical waveguide layer 120 and the diffraction grating layer 121), the cladding layer 101, and the contact layers 113 and 123 have a stripe mesa structure extending in a predetermined light guiding direction on the principal surface 3a of the semiconductor substrate 3. The width of the stripe mesa structure in a direction orthogonal to the light guiding direction is, for example, 1.5 µm. The thicknesses and the widths of the gain waveguides 11 and the refractive-index controlling waveguides 12 are set so that light can be optically guided in a single transverse mode in a wavelength tunable range (e.g., 1.52 µm to 1.58 µm) of the semiconductor laser 1A and that light can be effectively confined in the waveguides. In detail, the thicknesses and the widths mentioned above are set so that an overlap integral of optical power distribution in a fundamental transverse mode between the gain waveguides 11 and the refractive-index controlling waveguides 12 is at maximum.

The stripe mesa structure is buried with semi-insulating regions 102a and 102b respectively on opposite side surfaces thereof. The semi-insulating regions 102a and 102b are composed of a semi-insulating semiconductor, such as Fe-doped InP.

Multiple anode electrodes 114 are respectively provided on the contact layers 113. The multiple anode electrodes 114 correspond to gain electrodes according to this embodiment and are used for injecting current into the gain waveguides 11. On the other hand, multiple anode electrodes 124 are respectively provided on the contact layers 123. The multiple anode electrodes 124 correspond to refractive-index controlling electrodes according to this embodiment and are used for injecting current into the refractive-index controlling waveguides 12 independently of the gain waveguides 11. The multiple anode electrodes 114 are respectively disposed on the corresponding contact layers 113 formed above the corresponding gain waveguides 11, while the multiple anode electrodes 124 are respectively disposed on the corresponding contact layers 123 formed above the corresponding refractive-index controlling waveguides 12. The anode electrodes 114 and 124 are ohmic electrodes composed of, for example, Ti/Pt/Au. The cathode electrode 103 mentioned above is provided on a back surface 3b of the semiconductor substrate 3. By connecting an external power source to the cathode electrode 103 and the anode electrodes 114, current can be injected into the gain waveguides 11. On the other hand, by connecting an external power source to the cathode electrode 103 and the anode electrodes 124, current can be injected into the refractive-index controlling waveguides 12. The cathode electrode 103 is an ohmic electrode composed of, for example, AuGe.

Although a single cathode electrode 103 is provided relative to the multiple anode electrodes 114 and 124 in this embodiment, multiple cathode electrodes corresponding to the multiple anode electrodes 114 and 124 may alternatively be provided.

As shown in FIG. 1A, the multiple anode electrodes 114 are interconnected by a wiring pattern 115. The wiring pattern 115 corresponds to a gain wiring pattern according to this embodiment. On the other hand, the multiple anode electrodes 124 are interconnected by a wiring pattern 125. The wiring pattern 125 corresponds to a refractive-index-controlling wiring pattern according to this embodiment.

The DFB region 10 is provided with an anti-reflection (AR) film (not shown) on an end facet thereof in the light guiding direction, and a laser beam is emitted from this end facet. The AR film has a reflectivity of, for example, 0.1%.

Next, the configuration of the DBR region 20 will be described with reference to FIGS. 1A to 3. As shown in these drawings, the DBR region 20 has a refractive-index controlling layer 201, a diffraction grating layer 202, a cladding layer 203, a contact layer 204, a cathode electrode 205, and an anode electrode 206.

The refractive-index controlling layer 201 constitutes an optical waveguide in the DBR region 20 and is optically coupled to the gain waveguides 11 and the refractive-index controlling waveguides 12 in the DFB region 10. The refractive-index controlling layer 201 in this embodiment is provided on the principal surface 3a of the semiconductor substrate 3 and is composed of, for example, undoped GaInAsP. The band gap wavelength of the refractive-index controlling layer 201 is shorter than the band gap wavelength of each active layer 110 in the DFB region 10 and is, for example, 1.3 µm. The refractive-index controlling layer 201 has a thickness of, for example, 300 nm. The refractive index of the refractive-index controlling layer 201 changes in accordance with the magnitude of current injected into the refractive-index controlling layer 201 via the cathode electrode 205 and the anode electrode 206.

The diffraction grating layer 202 is provided along the refractive-index controlling layer 201. In this embodiment, the diffraction grating layer 202 is provided directly on the refractive-index controlling layer 201. The diffraction grating layer 202 has a thickness of, for example, 50 nm. The diffraction grating layer 202 is formed of a double-layered structure including, for example, a p-type GaInAsP layer and a p-type InP layer formed on this p-type GaInAsP layer. The diffraction grating layer 202 has a super-structure grating (SSG) 202a (see FIG. 1C) corresponding to a second diffraction grating according to this embodiment. The SSG 202a is formed on, for example, a surface of the p-type GaInAsP layer of the diffraction grating layer 202. The p-type InP layer is embedded in periodic projections and recesses of the SSG 202a. A reflection spectrum of the diffraction grating layer 202 has a plurality of reflectivity peak wavelengths. The reflectivity peak wavelengths are spaced apart from each other by a predetermined wavelength interval (second wavelength interval according to this embodiment). The refractive index of the refractive-index controlling layer 201 changes in accordance with the magnitude of current injecting into the refractive-index controlling layer 201 via the cathode electrode 205 and the anode electrode 206. As a result, the reflectivity peak wavelengths of the diffraction grating layer 202 are shifted. The interval between the reflectivity peak wavelengths in the reflection spectrum of the SSG 202a differs from the interval between the reflectivity peak wavelengths in the reflection spectrum of the DFB region 10 including the diffraction gratings 121a.

Of the light propagating from the DFB region 10 to the DBR region 20, a wavelength component corresponding to each reflectivity peak wavelength is reflected towards the DFB region 10 by the diffraction grating layer 202. The reflectivity from the DBR region 20 towards the DFB region 10 preferably ranges between 50% and 90%.

The SSG 202a has a configuration in which the grating period changes continuously in a plurality of segments arranged at a predetermined interval. For example, this grating period is set so that the diffraction wavelength changes from 1524 nm to 1576 nm in each segment of the SSG 202a. The interval between the reflectivity peak wavelengths and the reflectivity at the reflectivity peak wavelengths are determined by a unit length Lu' (see FIG. 1C) of each segment of the SSG 202a in the diffraction grating layer 202 and a unit number N of the segments of the SSG 202a. For example, the interval between the reflectivity peak wavelengths is 4.8 nm and the reflectivity at the reflectivity peak wavelengths is 90% when Lu'=59 μm and N=8.

A coupling coefficient of each diffraction grating 121a described above is preferably greater than a coupling coefficient of the SSG 202a. When the duty ratio (projection-width/diffraction-grating period) of the diffraction grating 121a is 0.5 and the thickness of the corresponding diffraction grating layer 121 is 50 nm, the coupling coefficient thereof is, for example, 100 cm$^{-1}$. When the duty ratio of the SSG 202a is 0.7 and the thickness of the diffraction grating layer 202 is 50 nm, the coupling coefficient thereof is, for example, 85 cm$^{-1}$.

In order to effectively confine light to the refractive-index controlling layer 201, the band gap wavelength of the p-type GaInAsP in the diffraction grating layer 202 is preferably shorter than the band gap wavelength of the refractive-index controlling layer 201 and is, for example, 1.2 μm. Then, the refractive index of the p-type GaInAsP in the diffraction grating layer 202 is smaller than that of the refractive-index controlling layer 201.

The cladding layer 203 is composed of a semiconductor of a second conductivity type, such as p-type InP, and is provided on the diffraction grating layer 202. The band gap wavelength of the cladding layer 203 is shorter than the band gap wavelengths of the refractive-index controlling layer 201 and the diffraction grating layer 202. The contact layer 204 is provided on the cladding layer 203. The contact layer 204 is composed of a semiconductor of a second conductivity type, such as p-type InGaAs.

Similar to the gain waveguides 11, the refractive-index controlling waveguides 12, the cladding layer 101, and the contact layers 113 and 123 in the DFB region 10, the refractive-index controlling layer 201, the diffraction grating layer 202, the cladding layer 203, and the contact layer 204 described above have a stripe mesa structure extending in the predetermined light guiding direction. The width of the stripe mesa structure in the direction orthogonal to the light guiding direction is, for example, 1.5 p.m.

The stripe mesa structure is buried with semi-insulating regions 207a and 207b respectively on opposite side surfaces thereof. The semi-insulating regions 207a and 207b are composed of a semi-insulating semiconductor, such as Fe-doped InP.

The anode electrode 206 is provided on the contact layer 204 for injecting current into the refractive-index controlling layer 201. The anode electrode 206 is an ohmic electrode composed of, for example, Ti/Pt/Au. The cathode electrode 205 is provided on the back surface 3b of the semiconductor substrate 3. By connecting an external power source to the cathode electrode 205 and the anode electrode 206, current is injected into the refractive-index controlling layer 201. The cathode electrode 205 is an ohmic electrode composed of, for example, AuGe.

The DBR region 20 is also provided with an AR film (not shown) on an end facet thereof in the light guiding direction. The AR film has a reflectivity of, for example, 0.1%. The cladding layer 203, the semi-insulating regions 207a and 207b, and the cathode electrode 205 described above may respectively be integrated with the cladding layer 101, the semi-insulating regions 102a and 102b, and the cathode electrode 103 in the DFB region 10.

As shown in FIG. 1A, an area on the upper surface of the semiconductor laser 1A that excludes the anode electrodes 114, 124 and 206 is protected by an insulating film 104 composed of, for example, SiO$_2$. The insulating film 104 is also provided between the contact layers 113 corresponding to the gain waveguides 11 and the contact layers 123 corresponding to the refractive-index controlling waveguides 12, so that paths for injecting current into the gain waveguides 11 are electrically separated from paths for injecting current into the refractive-index controlling waveguides 12.

Figure 4:
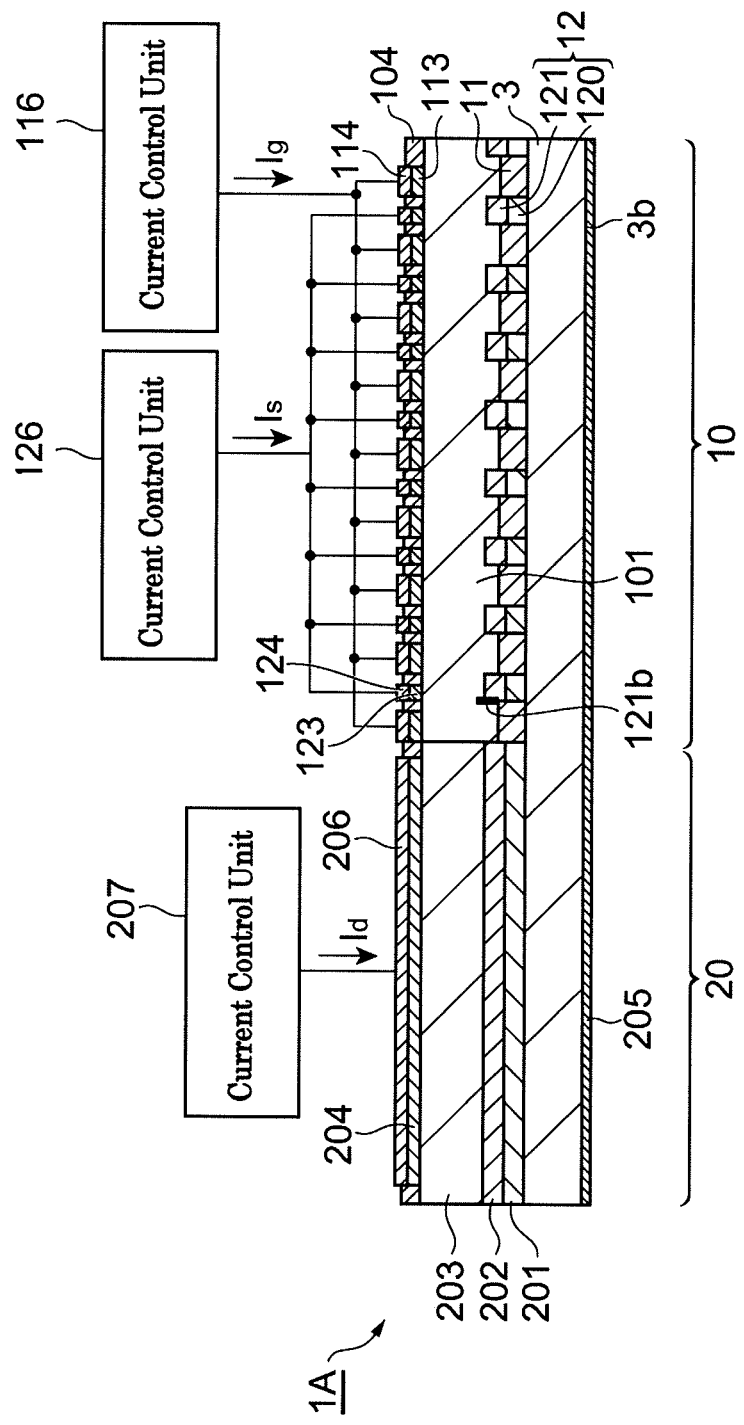
FIG. 4 illustrates a configuration for supplying current to the semiconductor laser shown in FIG. 1A.

FIG. 4 illustrates a configuration for supplying current to the anode electrodes 114, 124, and 206 of the semiconductor laser 1A. In the DFB region 10, the multiple anode electrodes 114 corresponding to the multiple gain waveguides 11 are connected to a single current control unit 116. Current Ig is supplied from the current control unit 116 to the multiple anode electrodes 114 for gain control. The multiple anode electrodes 124 corresponding to the multiple refractive-index controlling waveguides 12 are connected to another single current control unit 126. Current Is is supplied from the current control unit 126 to the multiple anode electrodes 124 for refractive-index control. The anode electrode 206 in the DBR region 20 is connected to another single current control unit 207. Current Id is supplied from the current control unit 207 to the anode electrode 206.

Next, the operation of the semiconductor laser 1A according to this embodiment will be described. First, the current Ig of more than threshold current is injected into the gain waveguides 11 via the anode electrodes 114. Then, light is emitted from the active layer 110 in the gain waveguides 11. The current Ig is, for example, 120 mA.

Figure 5A:
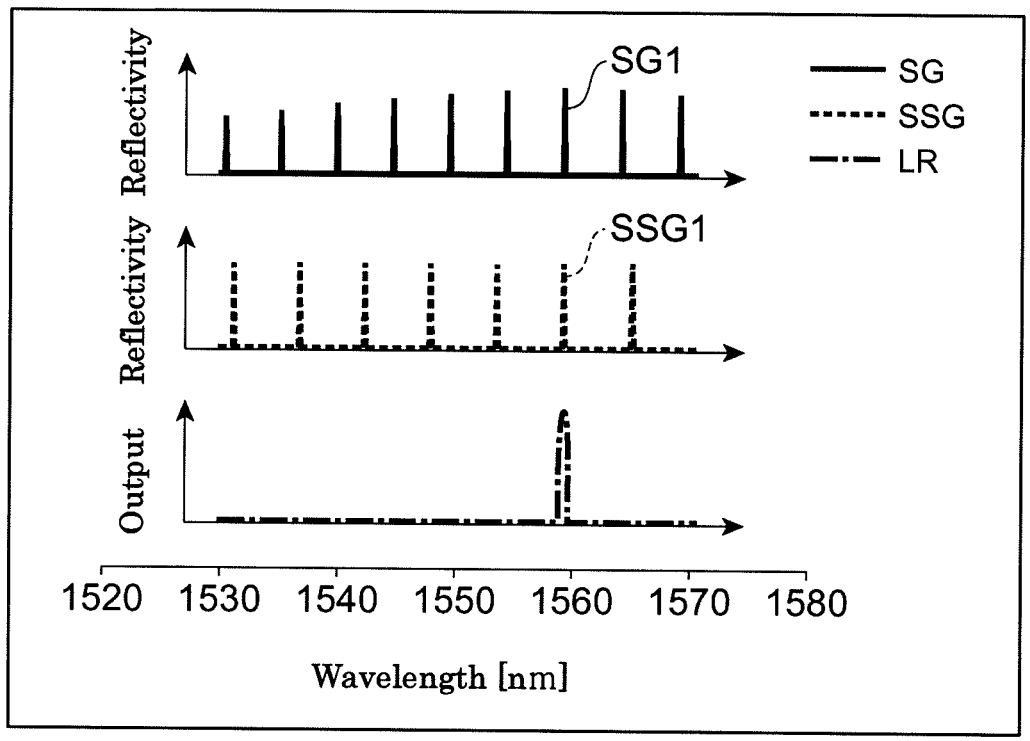
FIG. 5A is a graph showing an example of a reflection spectrum of a first reflective region, a reflection spectrum of a second reflection region having a super-structure grating (SSG), and an emission spectrum of the laser.

In this case, for example, if no current is supplied to the anode electrodes 124 and 206 (i.e., Id=Is=0 mA), the wavelength of a reflectivity peak SG1 in the reflection spectrum (graph SG) of the DFB region 10 overlaps the wavelength of a reflectivity peak SSG1 in the reflection spectrum (graph SSG) of the SSG 202a, as shown in FIG. 5A. As a result, lasing occurs at the overlapping wavelength (graph LR).

Supposedly, an amount of current injected per unit length is defined as Ib [mA/μA]. In this case, the current Id supplied from the current control unit 207 to the DBR region 20 via the anode electrode 206 and the current Is for refractive-index control supplied from the current control unit 126 to the refractive-index controlling waveguides 12 via the anode electrodes 124 are controlled so that the current Id and the current Is satisfy the relationships: Id=Ib×Lu'×N and Is=Ib×Ls×M. Specifically, when the current Id and the current Is are injected with maintaining the same amount of current injected per unit length, the reflectivity peaks SG1 and SSG1 would shift continuously towards the shorter wavelength side while the peak wavelengths are in an overlapped state. In consequence, the lasing wavelength can be continuously changed towards the shorter wavelength side.

When the amount of current injected per unit length Ib is changed by 0 to 0.1 mA/λm starting from Id=Is=0 [mA], the current Is is changed from 0 mA to 9.6 mA and the current Id is changed from 0 mA to 47.2 mA. As shown as graph A in FIG. 6, the lasing wavelength can be controlled so as to change continuously within about a 4 nm range.

Figure 5B:
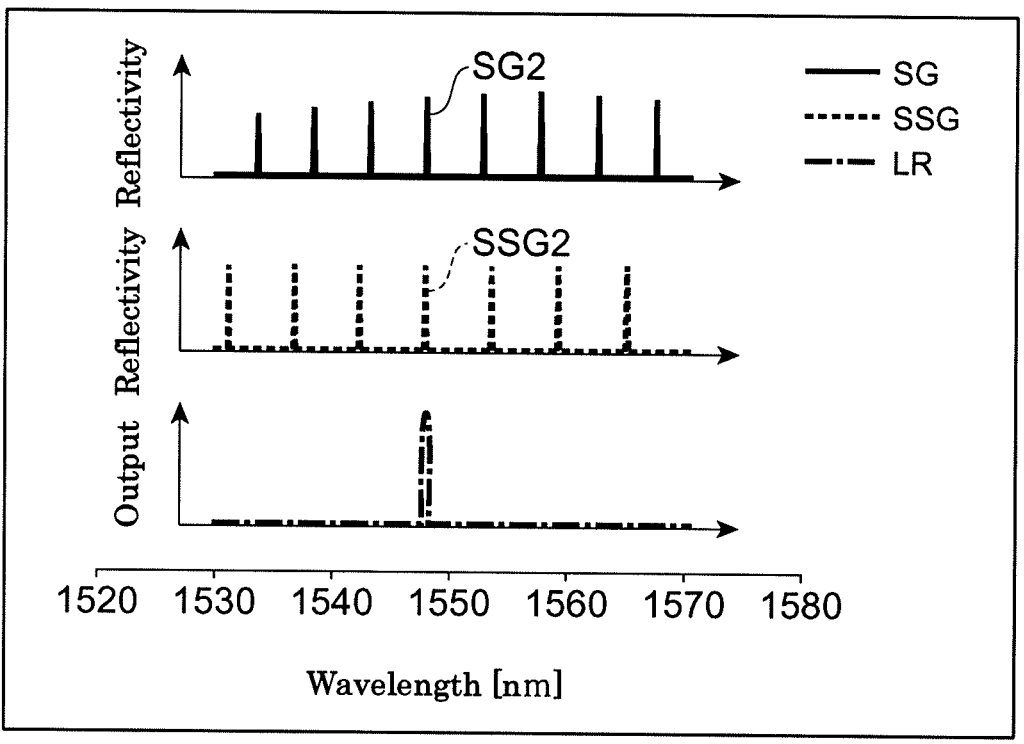
FIG. 5B is a graph showing another example of a reflection spectrum of the first reflective region, a reflection spectrum of the second reflection region having the SSG, and an emission spectrum of the laser.

When the amounts of current to be supplied to the anode electrodes 124 and 206 are set as follows: Is=0.576 mA and Id=0 mA, for example, the wavelength of a reflectivity peak SG2 in the reflection spectrum (graph SG) of the DFB region 10 and the wavelength of a reflectivity peak SSG2 in the reflection spectrum (graph SSG) of the SSG 202a overlap each other, and lasing occurs at this wavelength (graph LR) as shown in FIG. 5B.

When the amount of current injected per unit length Ib is changed by 0 to 0.1 mA/λm starting from Is=0.576 mA and Id=0 mA, the current Is and the current Id are controlled so that the current Is changes from 0.576 mA to 10.176 mA and the current Id changes from 0 mA to 47.2 mA. As shown as graph C in FIG. 6, the lasing wavelength changes continuously within about a 4 nm range, which is a wavelength range different from that in graph A.

Figure 6:
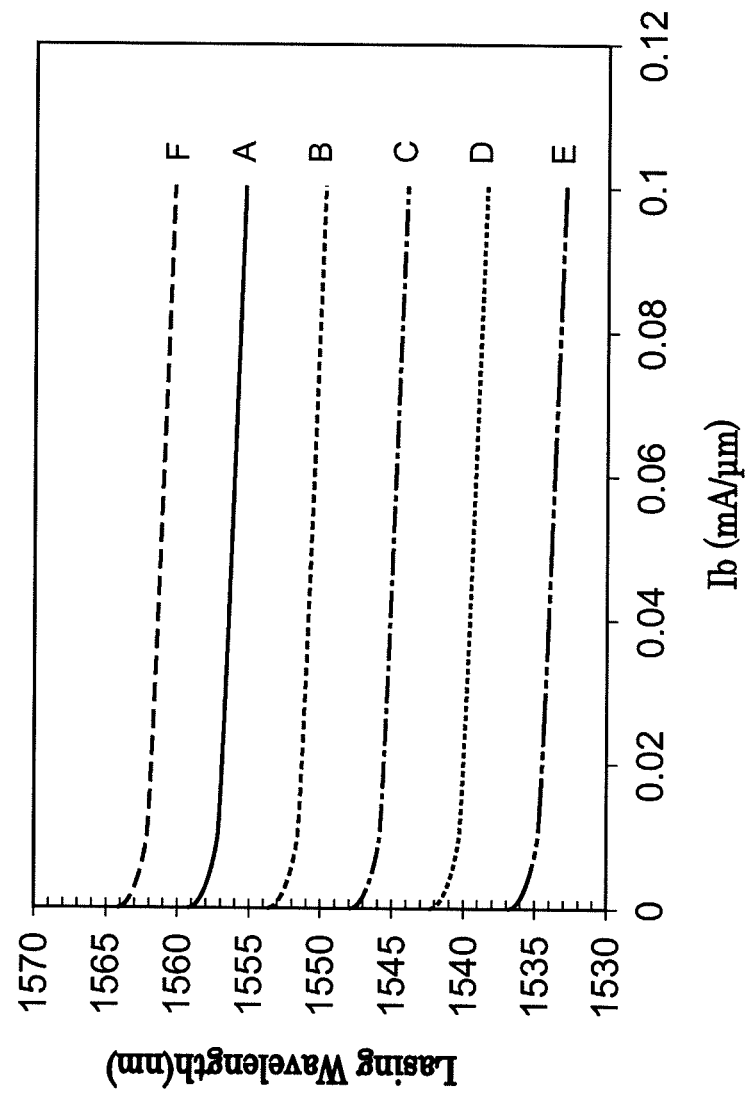
FIG. 6 is a graph showing changes in lasing wavelength occurring when an amount of current injected per unit length Ib is changed.

FIG. 6 also shows graph B and graphs D to F. Graph B illustrates a change in the lasing wavelength when the amount of current injected per unit length Ib is changed by 0 to 0.1 mA/λm starting from Is=0.115 mA and Id=0 mA. Graphs D to F illustrate changes in the lasing wavelength when the amount of current injected per unit length Ib is changed by 0 to 0.1 mA/λm starting from Is=1.728 mA and Id=0 mA (graph D), when the amount of current injected per unit length Ib is changed by 0 to 0.1 mA/λm starting from Is=4.8 mA and Id=0 mA (graph E), and when the amount of current injected per unit length Ib is changed by 0 to 0.1 mA/λm starting from Is=0 mA and Id=0.661 mA (graph F), respectively. The following table 1 collectively shows the initial values of the current Id and the current Is in graphs A to F, as well as Lu', Ls, N, and M values.

TABLE 1

| | $Id_{(min)}$ (mA) | $Is_{(min)}$ (mA) | Lu' (μm) | Ls (μm) | N | M |
|---|---|---|---|---|---|---|
| A | 0 | 0 | 59 | 12 | 8 | 8 |
| B | 0 | 0.115 | 59 | 12 | 8 | 8 |
| C | 0 | 0.576 | 59 | 12 | 8 | 8 |
| D | 0 | 1.728 | 59 | 12 | 8 | 8 |
| E | 0 | 4.8 | 59 | 12 | 8 | 8 |
| F | 0.661 | 0 | 59 | 12 | 8 | 8 |

Figure 7A:
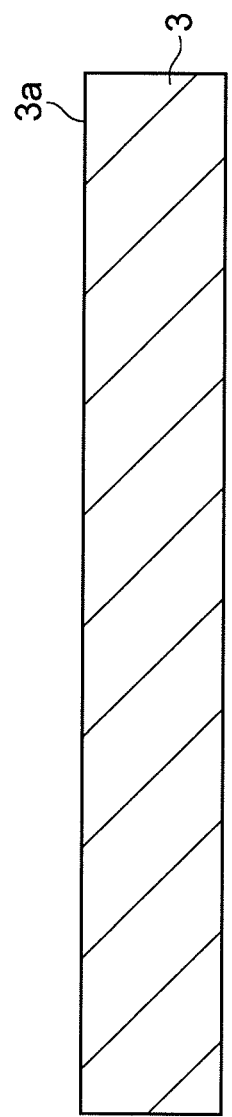
FIG. 7A illustrates a cross-sectional view showing the process for manufacturing the semiconductor laser shown in FIG. 1A.
Figure 7B:
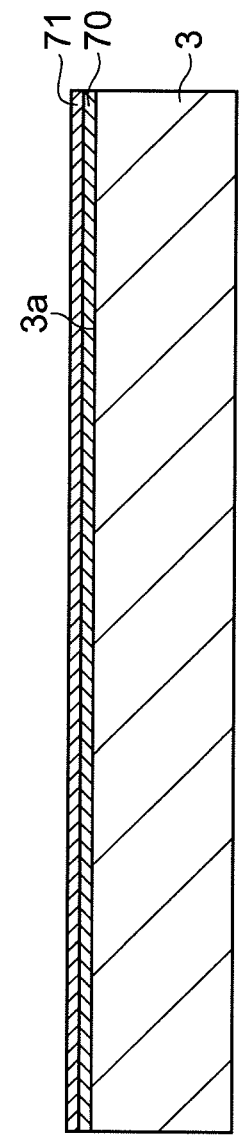
FIG. 7B illustrates a cross-sectional view showing the process subsequent to the process of FIG. 7A.

Next, a method for manufacturing the semiconductor laser 1A according to this embodiment will be described. First, as shown in FIG. 7A, the semiconductor substrate 3 composed of n-type InP is prepared. Then, as shown in FIG. 7B, undoped GaInAsP layers 70 and 71 are sequentially epitaxially grown on the principal surface 3a of the semiconductor substrate 3 by a metal-organic vapor phase epitaxy (MOVPE) method. The GaInAsP layer 70 is a layer for forming the optical waveguide layers 120 of the refractive-index controlling waveguides 12 and the refractive-index controlling layer 201 of the DBR region 20. On the other hand, the GaInAsP layer 71 is a layer for forming part of the diffraction grating layers 121 of the refractive-index controlling waveguides 12 and part of the diffraction grating layer 202 of the DBR region 20.

Next, by an electron-beam exposure technique, patterns for SGs and a phase shift region are formed onto areas of the GaInAsP layer 71 that are to become the refractive-index control waveguides 12. And a pattern for an SSG is formed onto an area of the GaInAsP layer 71 that is to become the DBR region 20. Subsequently, the GaInAsP layer 71 is processed by dry etching, thereby forming the diffraction gratings 121a and the SSG 202a. Then, a p-type InP layer is formed on the GaInAsP layer 71 by an epitaxial growth technique.

Next, areas of the GaInAsP layers 70 and 71 that are to become the gain waveguides 11 are removed by dry etching. The remaining areas of the GaInAsP layers 70 and 71 become the optical waveguide layers 120 and the refractive-index controlling layer 201 as well as the diffraction grating layers 121 and 202, as shown in FIG. 8A. Then, the optical confinement layers 111 formed of undoped GaInAsP layers, the active layers 110 formed of GaInAsP MQW structures, and the optical confinement layers 112 formed of undoped GaInAsP layers are stacked in that order by the MOVPE method in the areas where the GaInAsP layers 70 and 71 are removed. As a result, as shown in FIG. 8B, the gain waveguides 11 constituted of the optical confinement layers 111, the active layers 110, and the optical confinement layers 112 are formed.

Figure 9A:
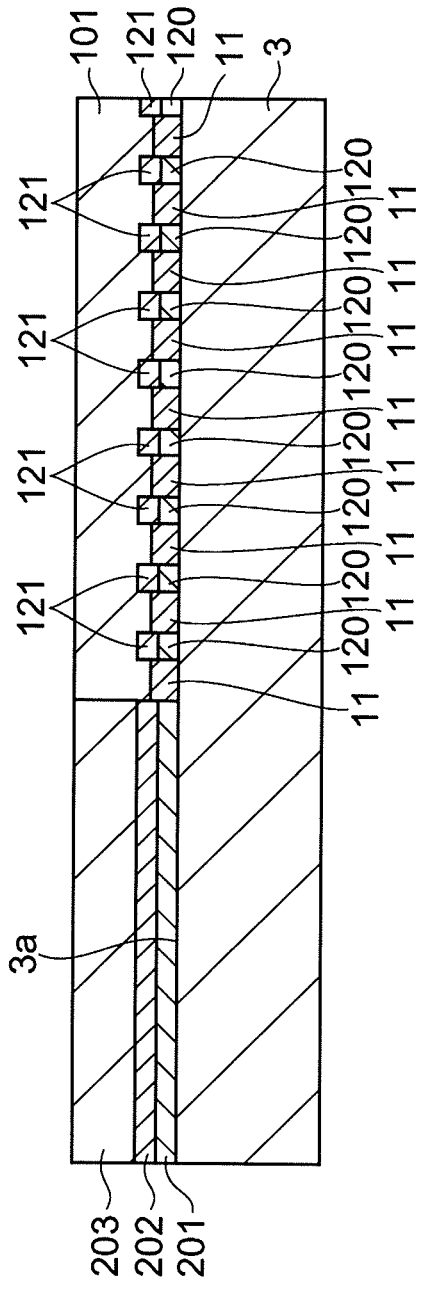
FIG. 9A illustrates a cross-sectional view showing the process subsequent to the process of FIG. 8B.
Figure 9B:
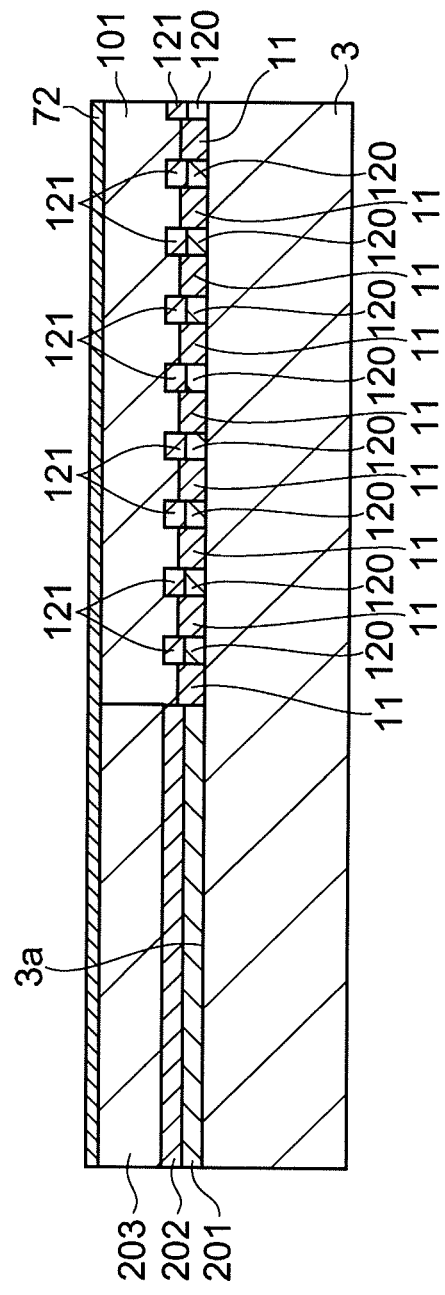
FIG. 9B illustrates a cross-sectional view showing the process subsequent to the process of FIG. 9A.

Subsequently, as shown in FIG. 9A, the cladding layers 101 and 203 composed of p-type InP are formed over the entire principal surface 3a of the semiconductor substrate 3, and a contact layer 72 composed of p-type InGaAs is formed by the MOVPE method (see FIG. 9B). Then, the multilayer structure on the principal surface 3a of the semiconductor substrate 3, excluding areas that are to become optical waveguides, is dry etched to the principal surface 3a so as to form a stripe mesa structure. Subsequently, the semi-insulating regions 102a, 102b, 207a, and 207b composed of Fe-doped InP are formed on the side surface of the stripe mesa structure and the exposed principal surface 3a of the semiconductor substrate 3 by the MOVPE method.

Figure 10A:
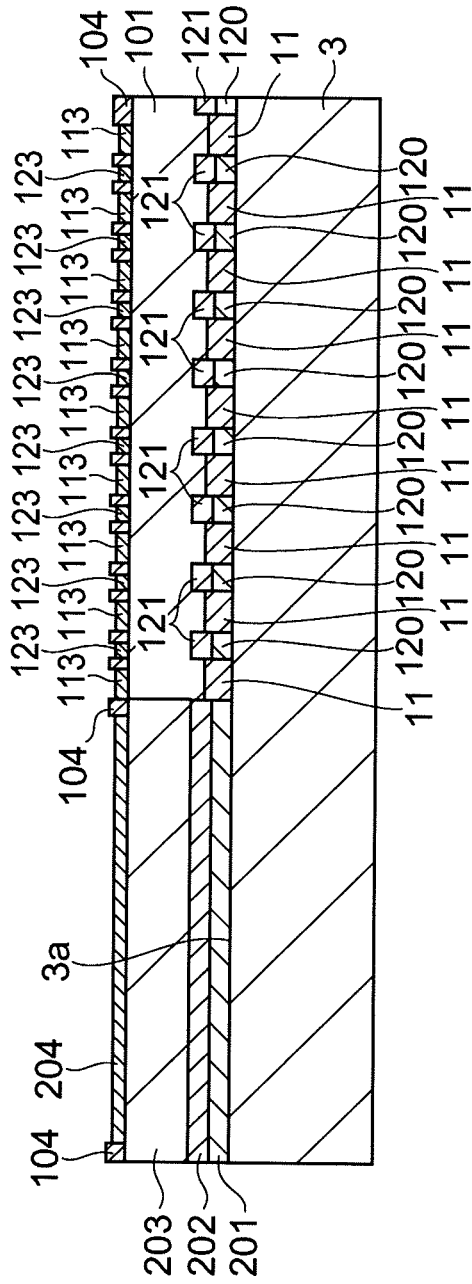
FIG. 10A illustrates a cross-sectional view showing the process subsequent to the process of FIG. 9B.
Figure 10B:
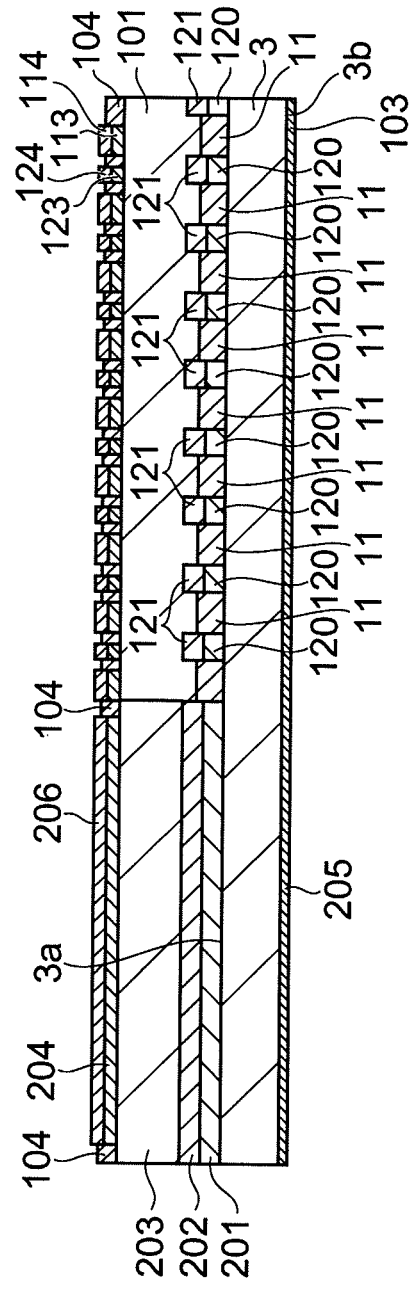
FIG. 10B illustrates a cross-sectional view showing the process subsequent to the process of FIG. 10A.

Then, the contact layer 72 composed of p-type InGaAs is partially removed by etching and divided in the light guiding direction, thereby forming the contact layers 113, 123, and 204, as shown in FIG. 10A. The insulating film 104 composed of, for example, SiO$_2$ is subsequently deposited over the entire surface of the multilayer structure by a CVD technique. Then, parts of the insulating film 104 located above the contact layers 113, 123, and 204 are removed by etching. By depositing Ti/Pt/Au on the contact layers 113, 123, and 204 by a liftoff technique, the anode electrodes 114, 124, and 206 are formed, as shown in FIG. 10B.

Subsequently, the semiconductor substrate 3 is ground to a thickness of about 100 μm from the underside thereof. Then, the cathode electrode 103 (205) is deposited over the back surface 3b of the semiconductor substrate 3. Finally, the semiconductor substrate 3 is divided into bars, and the end facets thereof are coated with AR films. Then, each of the bar-shaped semiconductor substrates 3 is divided into chips, thereby forming semiconductor laser chips. Each of these semiconductor laser chips is mounted on a chip carrier, and electrode pads of the anode electrodes 114, 124, and 206 are each given a wire bonding treatment. Consequently, the semiconductor laser 1A according to this embodiment is completed.

In this embodiment, the diffraction grating layer 202 may have an SG in place of the SSG 202a. One advantage of the diffraction grating layer 202 having the SSG 202a is that the SSG 202a can achieve higher reflectivity with a shorter waveguide length than that of an SG. By achieving higher reflectivity, an higher output can be obtained from the front end facet of the semiconductor laser 1A.

The following is a specific example where an SG is used in the diffraction grating layer 202. Specifically, a coupling coefficient κ1 of each diffraction grating 121a in the DFB region 10 and a coupling coefficient κ2 of the SG in the DBR region 20 are equal to each other, for example, κ1=κ2=150 cm$^{-1}$. The diffraction grating layers 121 and 202 each have a thickness of, for example, 80 nm, and the duty ratio for both the DFB region 10 and the DBR region 20 is, for example, 0.5. With regard to the DFB region 10, for example, Ls=6 μm, Lb=65 μm, M=7, and Lg=55 μm. With regard to the DBR region 20, for example, Ls=6 μm, Lb=56 μm, and M=8.

Second Embodiment

Figure 11A:
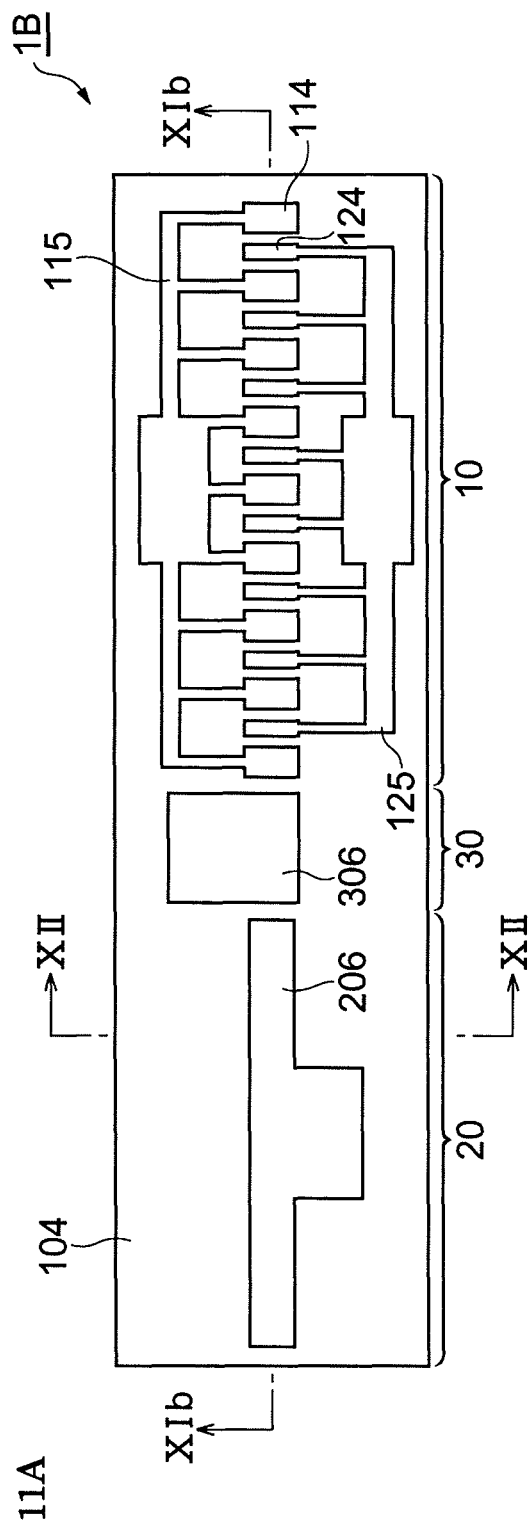
FIG. 11A is a plan view of a semiconductor laser according to a second embodiment.
Figure 11B:
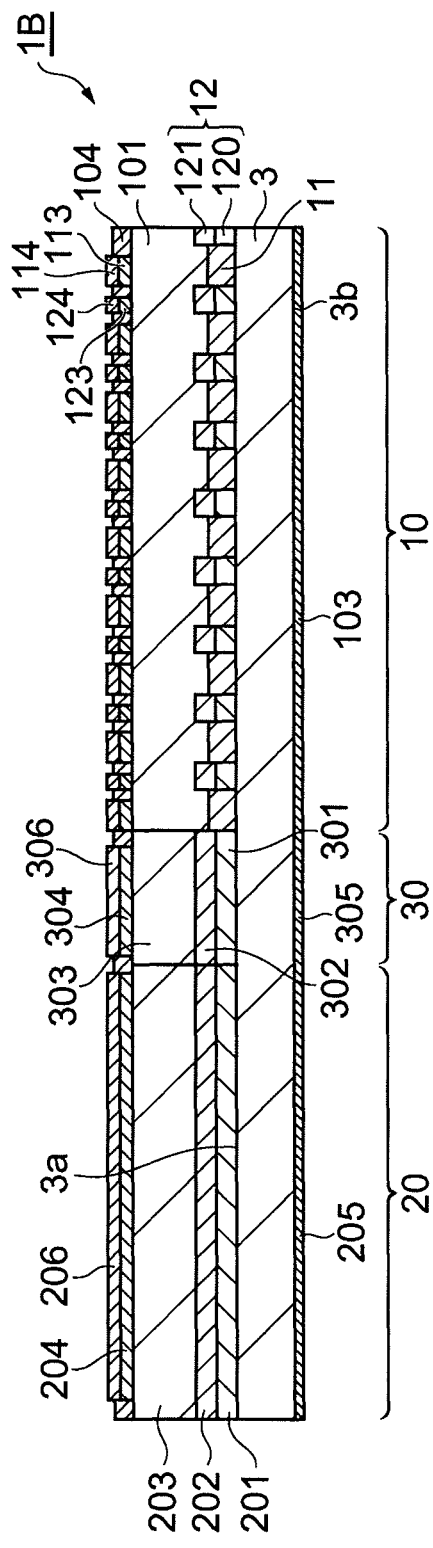
FIG. 11B is a cross-sectional view of the semiconductor laser taken along line XIb-XIb in FIG. 11A.

Similar to the semiconductor laser 1A according to the first embodiment, a semiconductor laser 1B according to a second embodiment is a tunable semiconductor laser that is capable of changing the lasing wavelength. Referring to FIGS. 11A and 11B, the semiconductor laser 1B according to this embodiment includes the DFB region 10, the DBR region 20, and a phase control region 30. The DFB region 10 corresponds to a first reflective region according to this embodiment and has the same configuration as that in the first embodiment. The DBR region 20 corresponds to a second reflective region according to this embodiment and has the same configuration as that in the first embodiment. The phase control region 30 is provided between the DFB region 10 and the DBR region 20 for controlling the optical path length between the DFB region 10 and the DBR region 20. In this embodiment, the DFB region 10, the DBR region 20 and the phase control region 30 provided between the DFB region 10 and the DBR region 20 constitute a laser cavity of the semiconductor laser 1B. Specifically, as shown in FIG. 11B, the DFB region 10, the phase control region 30, and the DBR region 20 are formed on the common semiconductor substrate 3 and are arranged in a light guiding direction that is a predetermined direction of an optical axis. The semiconductor substrate 3 serves as a lower cladding layer also for an optical waveguide in the phase control region 30.

Figure 12:
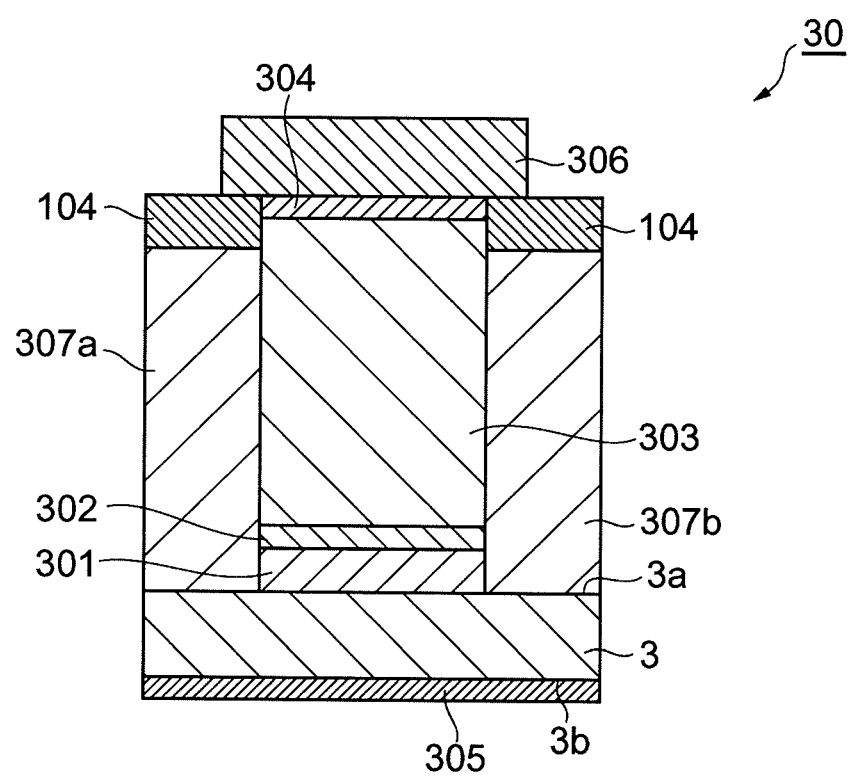
FIG. 12 is a cross-sectional view of the semiconductor laser taken along line XII-XII in FIG. 11A.

The configuration of the phase control region 30 will be described with reference to FIGS. 11A to 12. The phase control region 30 has an optical waveguide layer 301, a diffraction grating layer 302, a cladding layer 303, a contact layer 304, a cathode electrode 305, and an anode electrode 306.

The optical waveguide layer 301 constitutes an optical waveguide in the phase control region 30, and one end thereof in the light guiding direction is optically coupled to the gain waveguides 11 and the refractive-index controlling waveguides 12 in the DFB region 10, while another end is optically coupled to the refractive-index controlling layer 201 in the DBR region 20. The optical waveguide layer 301 according to this embodiment is provided on the principal surface 3a of the semiconductor substrate 3 and is composed of, for example, undoped GaInAsP. The band gap wavelength of the optical waveguide layer 301 is shorter than the band gap wavelength of the active layers 110 in the DFB region 10 and is, for example, 1.3 μm. The optical waveguide layer 301 has a thickness of, for example, 300 nm. The refractive index of the optical waveguide layer 301 changes in accordance with the magnitude of current injected into the optical waveguide layer 301 via the cathode electrode 305 and the anode electrode 306.

The diffraction grating layer 302 is provided on the optical waveguide layer 301 and has a thickness of, for example, 50 nm. Similar to the diffraction grating layers 121 in the DFB region 10 and the diffraction grating layer 202 in the DBR region 20, the diffraction grating layer 302 is composed of, for example, p-type GaInAsP and p-type InP formed on the p-type GaInAsP. However, the diffraction grating layer 302 is not provided with a diffraction grating, and the optical waveguide layer 301 and the diffraction grating layer 302 together constitute an optical waveguide.

The cladding layer 303 is composed a semiconductor of a second conductivity type, such as p-type InP, and is provided on the diffraction grating layer 302. The band gap wavelength of the cladding layer 303 is shorter than the band gap wavelengths of the optical waveguide layer 301 and the diffraction grating layer 302. The contact layer 304 is provided on the cladding layer 303. The contact layer 304 is composed of a semiconductor of a second conductivity type, such as p-type InGaAs.

Similar to the DFB region 10 and the DBR region 20, the optical waveguide layer 301, the diffraction grating layer 302, the cladding layer 303, and the contact layer 304 have a stripe mesa structure extending in the predetermined light guiding direction. The width of the stripe mesa structure in the direction orthogonal to the light guiding direction is, for example, 1.5 μm.

The stripe mesa structure is buried with semi-insulating regions 307a and 307b respectively on opposite side surfaces thereof. The semi-insulating regions 307a and 307b are composed of, for example, Fe-doped InP.

The anode electrode 306 is provided on the contact layer 304 for injecting current into the optical waveguide layer 301. The anode electrode 306 is an ohmic electrode composed of, for example, Ti/Pt/Au. The cathode electrode 305 is provided on the back surface 3b of the semiconductor substrate 3. By connecting an external power source to the cathode electrode 305 and the anode electrode 306, current is injected into the optical waveguide layer 301. The cathode electrode 305 is an ohmic electrode composed of, for example, AuGe.

The cladding layer 303 mentioned above may be integrated with the cladding layer 101 in the DFB region 10 and the cladding layer 203 in the DBR region 20. Likewise, the semi-insulating regions 307a and 307b may be integrated with the semi-insulating regions 102a and 102b in the DFB region 10 and the semi-insulating regions 207a and 207b in the DBR region 20, and the cathode electrode 305 may be integrated with the cathode electrode 103 in the DFB region 10 and the cathode electrode 205 in the DBR region 20.

Figure 13:
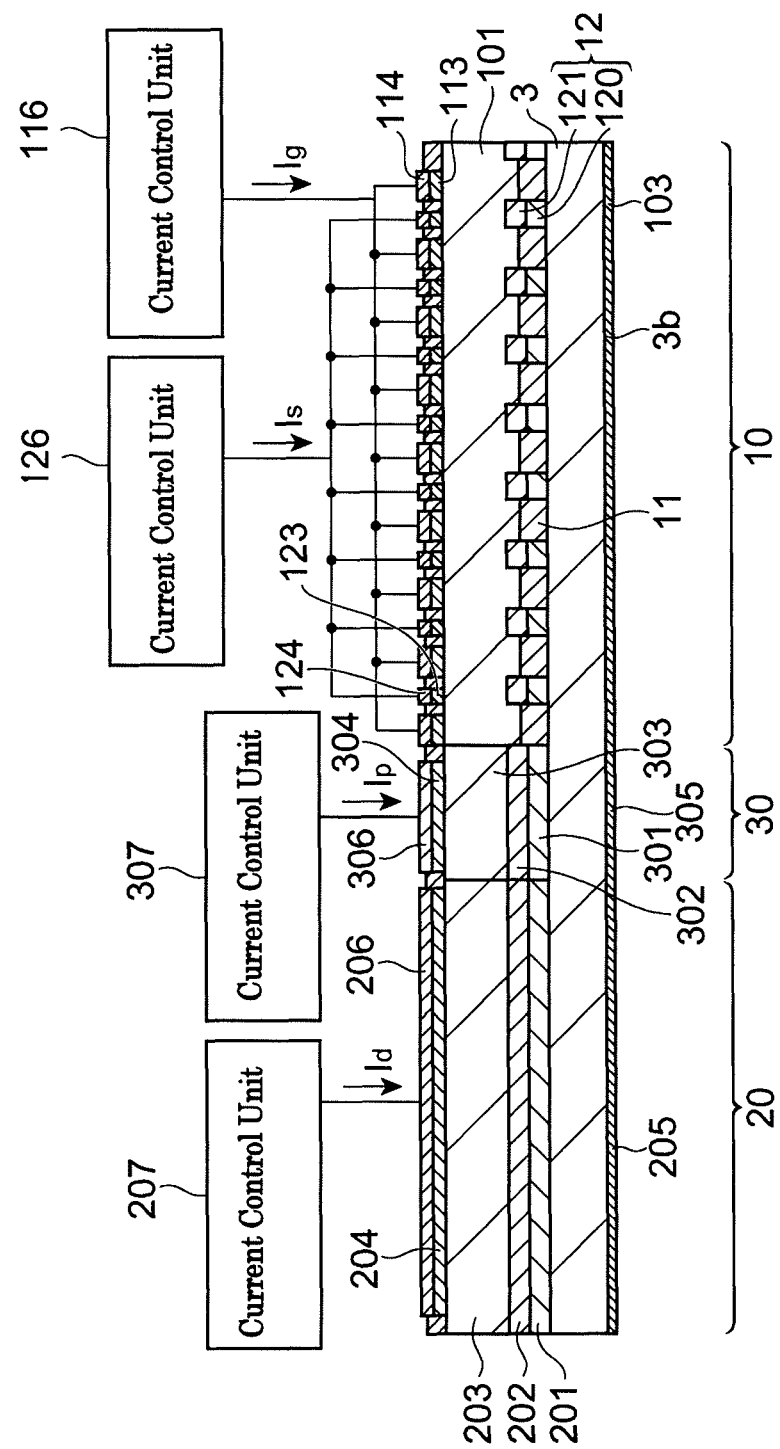
FIG. 13 illustrates a configuration for supplying current to the semiconductor laser shown in FIG. 11A.

FIG. 13 illustrates a configuration for supplying current to the anode electrodes 114, 124, 206, and 306 of the semiconductor laser 1B. As described in the first embodiment, the multiple anode electrodes 114 are connected to the current control unit 116 so as to be supplied with the current Ig for gain control. The multiple anode electrodes 124 are connected to the current control unit 126 so as to be supplied with the current Is for refractive-index control. The anode electrode 206 in the DBR region 20 is connected to the current control unit 207 so as to be supplied with the current Id. Furthermore, in this embodiment, the anode electrode 306 in the phase control region 30 is connected to another current control unit 307 so as to be supplied with current Ip.

With the DFB region 10 and the DBR region 20 equipped in the semiconductor laser 1B according to this embodiment, the same advantages as those of the first embodiment can be achieved. Moreover, in the phase control region 30, the refractive index of the optical waveguide layer 301 changes in accordance with the magnitude of current injected into the optical waveguide layer 301 via the cathode electrode 305 and the anode electrode 306, as mentioned above. Thus, the optical path length in the phase control region 30 can be changed so as to adjust the phase of light propagating through the optical waveguide formed in the semiconductor laser 1B according to this embodiment. If the phase of the diffraction gratings 121a (see FIGS. 1A to 1C) in the DFB region 10 and the phase of the SSG 202a in the DBR region 20 are misaligned with each other, the lasing wavelength deviates from a predetermined wavelength. However, it is difficult to align the phases of these diffraction gratings during the manufacturing process of the diffraction gratings. By providing the phase control region 30 and adjusting the injected current, a deviation in the lasing wavelength caused by the misalignment in the phases of the diffraction gratings at the time of manufacture can be compensated. In consequence, the lasing wavelength can be finely adjusted so that a desired lasing wavelength is obtained. In other words, providing the phase control region 30 eliminates the need for aligning the phases of the diffraction gratings during the manufacturing stage of the semiconductor laser 1B. This facilitates the manufacturing process of the diffraction gratings 121a and 202a accordingly.

Third Embodiment

Figure 14:
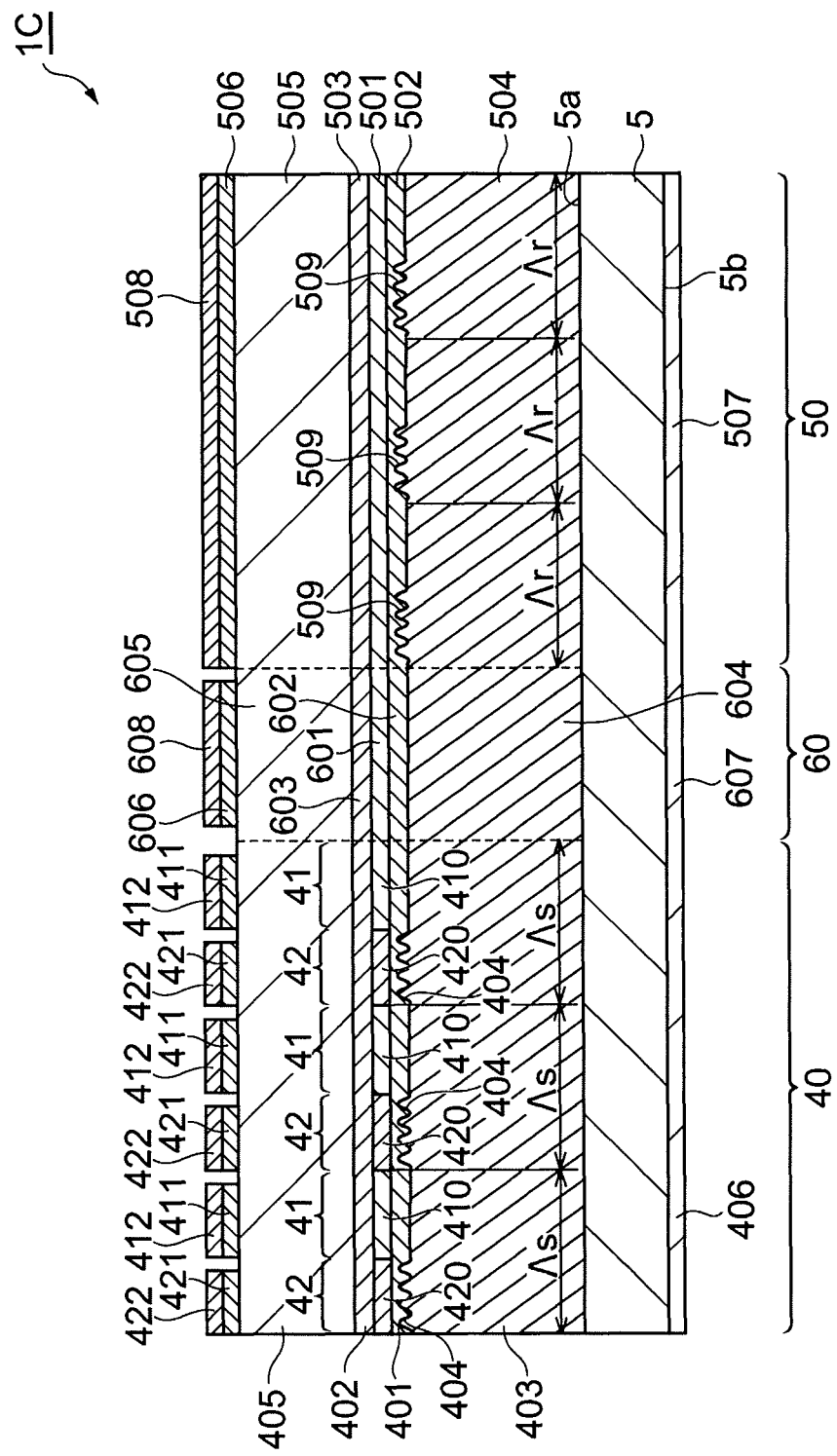
FIG. 14 is a cross-sectional view of a semiconductor laser according to a third embodiment, taken in a light guiding direction.
Figure 15:
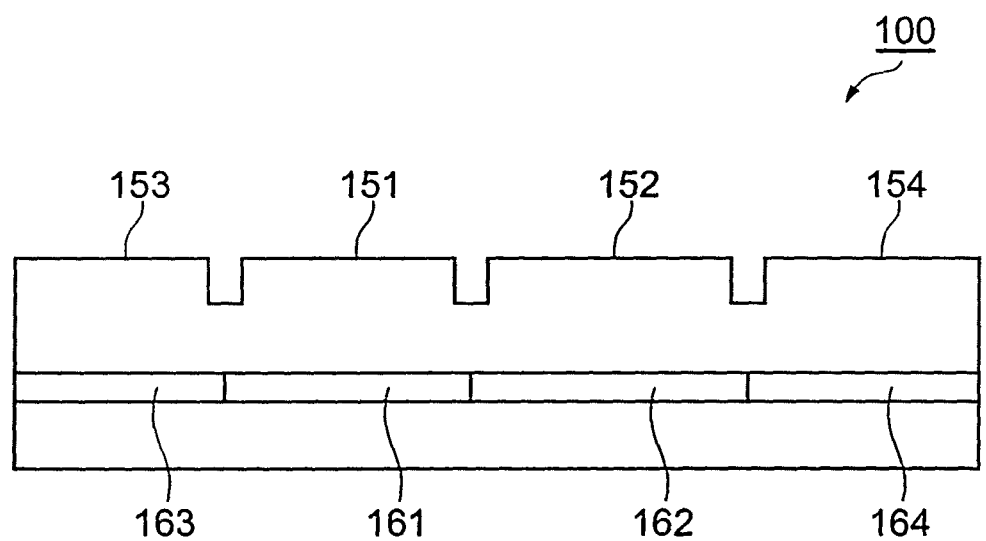
FIG. 15 is a schematic cross-sectional view showing the configuration of a semiconductor laser of related art.

Similar to the semiconductor laser 1A according to the first embodiment and the semiconductor laser 1B according to the second embodiment, a semiconductor laser 1C according to a third embodiment is a tunable semiconductor laser that is capable of changing the lasing wavelength. Referring to FIG. 14, the semiconductor laser 1C according to this embodiment includes a DFB region 40, a DBR region 50, and a phase control region 60. The DFB region 40 corresponds to a first reflective region according to this embodiment and is configured to amplify and reflect light of a specific wavelength. The DBR region 50 corresponds to a second reflective region according to this embodiment and is configured to reflect a light with the specific wavelength from the DFB region 40. The phase control region 60 is provided between the DFB region 40 and the DBR region 50 for controlling the optical path length between the DFB region 40 and the DBR region 50. In this embodiment, the DFB region 40, the DBR region 50 and the phase control region 60 provided between the DFB region 40 and the DBR region 50 constitute a laser cavity of the semiconductor laser 1C. As shown in FIG. 14, the DFB region 40, the phase control region 60, and the DBR region 50 are formed on a common semiconductor substrate 5 and are arranged in that order in a light guiding direction that is a predetermined direction of an optical axis. The semiconductor substrate 5 is composed of a semiconductor of a first conductivity type, such as n-type InP. The length of the DFB region 40 in the light guiding direction ranges between, for example, 200 μm and 600 μm.

The DFB region 40 includes a plurality of gain waveguides 41 and a plurality of refractive-index controlling waveguides 42. The gain waveguides 41 and the refractive-index controlling waveguides 42 are alternately arranged at a predetermined pitch in the light guiding direction.

The gain waveguides 41 each have an active layer 410. The active layer 410 has, for example, an MQW structure including a plurality of well layers and barrier layers alternately stacked one on top of the other. The active layer 410 is configured to generate light by current injection. The well layers and the barrier layers constituting the quantum well structure are composed of GaInAsP or AlGaInAs with different compositions.

The refractive-index controlling waveguides 42 each have an optical waveguide layer 420. The optical waveguide layer 420 is composed of, for example, undoped GaInAsP. The band gap wavelength of the optical waveguide layer 420 is shorter than the band gap wavelength of each active layer 410 in the DFB region 40. In other words, the band gap energy of the optical waveguide layer 420 is greater than the band gap energy of the active layer 410 in the DFB region 40. The band gap wavelength of the optical waveguide layer 420 is, for example, 1.3 μm. Thus, since light absorption in the optical waveguide layer 420 can be reduced, a threshold current can be reduced and a slope efficiency can be increased. The optical waveguide layer 420 has a thickness of, for example, 300 nm. The refractive index of the optical waveguide layer 420 changes in accordance with the magnitude of current injected into the optical waveguide layer 420 through a cathode electrode 406 and an anode electrode 412, to be described later.

A lower optical confinement layer 401 and an upper optical confinement layer 402 are provided above and below the active layers 410 and the optical waveguide layers 420. The lower optical confinement layer 401 and the upper optical confinement layer 402 are composed of, for example, undoped GaInAsP and have a band gap wavelength that is shorter than the band gap wavelengths of the active layers 410 and the optical waveguide layers 420.

A lower cladding layer 403 is provided between the lower optical confinement layer 401 and the semiconductor substrate 5. The lower cladding layer 403 is composed of a semiconductor of a first conductivity type, such as n-type InP. In the interface between the lower optical confinement layer 401 and the lower cladding layer 403, diffraction gratings 404 of the refractive-index controlling waveguides 42 are formed in areas directly below the optical waveguide layers 420. The diffraction gratings 404 correspond to first diffraction gratings according to this embodiment.

The diffraction gratings 404 of the respective refractive-index controlling waveguides 42 are arranged in the light guiding direction at an interval defined by the gain waveguides 41, and are not formed in the gain waveguides 41. Specifically, multiple unit structures As each constituted of an area provided with a diffraction grating 404 and an area not provided with a diffraction grating 404 are formed in the interface between the lower optical confinement layer 401 and the lower cladding layer 403. The length of each unit structure Λs ranges between, for example, 25 μm and 250 μm. The length of an area occupied by the diffraction grating 404 in each unit structure Λs (i.e., the length of the corresponding refractive-index controlling waveguide 42) is, for example, 5% to 50% of the overall length of the unit structure Λs. The grating period of the diffraction gratings 404 is fixed over the plurality of refractive-index controlling waveguides 42.

According to this configuration, the DFB region 40 has SGs. As a result, a reflection spectrum of the DFB region 40 has discrete reflectivity peak wavelengths that vary periodically at a predetermined wavelength interval (first wavelength interval according to this embodiment). By injecting current into the optical waveguide layers 420 to change the refractive index thereof, the reflectivity peak wavelengths of the DFB region 40 can be shifted. Specific configurations, such as the grating period of the diffraction gratings 404, are the same as those of the diffraction gratings 121a in the first embodiment.

The DFB region 40 further includes a cladding layer 405 and contact layers 411 and 421. The cladding layer 405 is provided on the upper optical confinement layer 402 and is composed of a semiconductor of a second conductivity type, such as p-type InP. The band gap wavelength of the cladding layer 405 is shorter than the band gap wavelength of the upper optical confinement layer 402.

The contact layers 411 are provided on parts of the cladding layer 405 that correspond to the gain waveguides 41. On the other hand, the contact layers 421 are provided on parts of the cladding layer 405 that correspond to the refractive-index controlling waveguides 42. The contact layers 411 and 421 are composed of a semiconductor of a second conductivity type, such as p-type InGaAs.

Although not shown, the active layers 410, the optical waveguide layers 420, the lower optical confinement layer 401, the upper optical confinement layer 402, the cladding layer 405, and the contact layers 411 and 421 have a stripe mesa structure extending in a predetermined light guiding direction on a principal surface 5a of the semiconductor substrate 5. The stripe mesa structure is buried with semi-insulating regions (not shown) respectively on opposite side surfaces thereof. The semi-insulating regions are composed of, for example, Fe-doped InP and cover the opposite side surfaces of the stripe mesa structure.

Multiple anode electrodes 412 are respectively provided on the contact layers 411. The multiple anode electrodes 412 correspond to gain electrodes according to this embodiment and are used for injecting current into the gain waveguides 41. On the other hand, multiple anode electrodes 422 are respectively provided on the contact layers 421. The multiple anode electrodes 422 correspond to refractive-index controlling electrodes according to this embodiment and are used for injecting current into the refractive-index controlling waveguides 42 independently of the gain waveguides 41. The anode electrodes 412 and 422 are electrically separated. The multiple anode electrodes 412 are respectively disposed on the corresponding contact layers 411 formed above the corresponding gain waveguides 41, while the multiple anode electrodes 422 are respectively disposed on the corresponding contact layers 421 formed above the corresponding refractive-index controlling waveguides 42. The anode electrodes 412 and 422 are ohmic electrodes composed of, for example, Ti/Pt/Au. The cathode electrode 406 mentioned above is provided on a back surface 5b of the semiconductor substrate 5. By connecting an external power source between the cathode electrode 406 and the anode electrodes 412, current is injected into the gain waveguides 41. Moreover, by connecting an external power source between the cathode electrode 406 and the anode electrodes 422, current is injected into the refractive-index controlling waveguides 42. The cathode electrode 406 is an ohmic electrode composed of, for example, AuGe.

The DFB region 40 is provided with an AR film (not shown) on an end facet thereof in the light guiding direction, and a laser beam is emitted from this end facet. The AR film has a reflectivity of, for example, 0.1%.

The DBR region 50 has a refractive-index controlling layer 501, a lower optical confinement layer 502, an upper optical confinement layer 503, cladding layers 504 and 505, a contact layer 506, a cathode electrode 507, and an anode electrode 508.

The refractive-index controlling layer 501 constitutes an optical waveguide in the DBR region 50 and is optically coupled to the gain waveguides 41 and the refractive-index controlling waveguides 42 in the DFB region 40. The refractive-index controlling layer 501 is composed of, for example, undoped GaInAsP. The band gap wavelength of the refractive-index controlling layer 501 is shorter than the band gap wavelength of each active layer 410 in the DFB region 40. The refractive index of the refractive-index controlling layer 501 changes in accordance with the magnitude of current injected into the refractive-index controlling layer 501 through the cathode electrode 507 and the anode electrode 508.

The lower optical confinement layer 502 and the upper optical confinement layer 503 are provided above and below the refractive-index controlling layer 501. The lower optical confinement layer 502 and the upper optical confinement layer 503 are composed of, for example, undoped GaInAsP and each have a band gap wavelength that is shorter than the band gap wavelength of the refractive-index controlling layer 501. The lower optical confinement layer 502 and the upper optical confinement layer 503 may respectively be integrated with the lower optical confinement layer 401 and the upper optical confinement layer 402 in the DFB region 40.

The lower cladding layer 504 is provided between the lower optical confinement layer 502 and the semiconductor substrate 5. The lower cladding layer 504 is composed of a semiconductor of a first conductivity type, such as n-type InP. In the interface between the lower optical confinement layer 502 and the lower cladding layer 504, an SSG 509 corresponding to a second diffraction grating according to this embodiment is formed along the refractive-index controlling layer 501. The SSG 509 is formed of a plurality of unit structures Λr, and each unit structure Λr is a chirped diffraction grating whose diffraction wavelength is in a wavelength tunable range. Specifically, supposing that a wavelength tunable range of the semiconductor laser 1C is expressed as $\lambda_1$ to $\lambda_2$ ($\lambda_1 < \lambda_2$) and an effective refractive index is expressed as $n_e$, the grating period of the chirped diffraction gratings in the unit structures Λr is within a range of $\Lambda_1$ and $\Lambda_2$ expressed by the following equation (2):

$$\Lambda_1 \leq \lambda_1/2n_e, \Lambda_2 \leq \lambda_2/2n_e \quad (2)$$

The DBR region 50 has this SSG 509. As a result, a reflection spectrum of the DBR region 50 has discrete reflectivity peak wavelengths that vary periodically at a predetermined wavelength interval (second wavelength interval according to this embodiment). With regard to the SSG 509, the refractive index of the refractive-index controlling layer 501 changes in accordance with the magnitude of current flowing to the refractive-index controlling layer 501 via the cathode electrode 507 and the anode electrode 508, to be described later. In consequence, the reflectivity peak wavelengths of the SSG 509 can be changed. The interval between the reflectivity peak wavelengths in the reflection spectrum by the SSG 509 is designed so as to be different from the interval between reflectivity peak wavelengths in the reflection spectrum by the diffraction gratings 404 in the DFB region 40. In other words, an optical path length of each of the unit structures Λs of the diffraction gratings 404 is different from an optical path length of each unit structure Λr of the SSG 509.

The cladding layer 505 is provided on the upper optical confinement layer 503 and is composed of a semiconductor of a second conductivity type, such as p-type InP. The band gap wavelength of the cladding layer 505 is shorter than the band gap wavelength of the upper optical confinement layer 503. The cladding layers 504 and 505 may respectively be integrated with the cladding layers 403 and 405 in the DFB region 40.

The contact layer 506 is provided on the cladding layer 505. The contact layer 506 is composed of a semiconductor of a second conductivity type, such as p-type InGaAs.

In the DBR region 50, the refractive-index controlling layer 501, the lower optical confinement layer 502, the upper optical confinement layer 503, the cladding layer 505, and the contact layer 506 have a stripe mesa structure extending in the predetermined light guiding direction on the principal surface 5a of the semiconductor substrate 5. Opposite side surfaces of the stripe mesa structure are respectively covered with semi-insulating regions composed of, for example, Fe-doped InP.

The anode electrode 508 is provided on the contact layer 506. The anode electrode 508 is an electrode for injecting current into the refractive-index controlling layer 501. The anode electrode 508 is an ohmic electrode composed of, for example, Ti/Pt/Au. The cathode electrode 507 is provided on the back surface 5b of the semiconductor substrate 5. Current is injected into the refractive-index controlling layer 501 through the anode electrode 508 and the cathode electrode 507. The cathode electrode 507 is an ohmic electrode composed of, for example, AuGe. The cathode electrode 507 may be integrated with the cathode electrode 406 in the DFB region 40.

The DBR region 50 is provided with an AR film (not shown) on an end facet thereof in the light guiding direction. The AR film has a reflectivity of, for example, 0.1%.

The phase control region 60 has a refractive-index controlling layer 601, a lower optical confinement layer 602, an upper optical confinement layer 603, cladding layers 604 and 605, a contact layer 606, a cathode electrode 607, and an anode electrode 608. Of these components, the refractive-index controlling layer 601, the upper optical confinement layer 603, the cladding layer 605, the contact layer 606, the cathode electrode 607, and the anode electrode 608 have the same configurations as those of the DBR region 50 described above. The lower optical confinement layer 602 and the cladding layer 604 have substantially the same configurations as those of the DBR region 50 except that diffraction gratings are not formed in the interface therebetween.

The semiconductor laser 1C having the above configuration is preferably manufactured in, for example, the following manner. First, a semiconductor layer that is to become the cladding layers 403, 504, and 604 and a semiconductor layer that is to become the lower optical confinement layers 401, 502, and 602 are epitaxially grown on the principal surface 5a of the semiconductor substrate 5. Then, a SiO$_2$ film is formed thereon, and stripe-shaped openings are formed in areas of this SiO$_2$ film that correspond to optical waveguides. In this case, the openings are formed such that the width thereof in the direction orthogonal to the light guiding direction is wide for the gain waveguides 41 and narrow for the refractive-index controlling waveguides 42.

For example, GaInAsP is selectively grown in the stripe-shaped openings by the MOVPE method by using the SiO$_2$ film as a mask. The band gap energy of the GaInAsP is high in the areas where the opening width is narrow, whereas the band gap energy of the GaInAsP is low in the areas where the opening width is wide. Therefore, the active layers 410 with a low band gap can be favorably formed in the gain waveguides 41, and the optical waveguide layers 420 that are transparent relative to light from the active layers 410 can be favorably formed in the refractive-index controlling waveguides 42. The refractive-index controlling layers 501 and 601 are simultaneously formed without an etching process.

Subsequently, the upper optical confinement layers 402, 503, and 603, the cladding layers 405, 505, and 605, and the contact layers 411, 421, 506, and 606 are formed in that order. Then, the cathode electrodes 406, 507, and 607 and the anode electrodes 412, 422, 508, and 608 are formed, whereby the semiconductor laser 1C according to this embodiment is manufactured.

The semiconductor laser according to the present invention is not limited to the above-described embodiments, and various modifications are permissible. For example, although SSG and SG are described as specific configurations of the DBR region in each of the above embodiments, other structures may be employed so long as the structure can achieve a wavelength-versus-reflectivity characteristic that has periodic peak wavelengths with a predetermined wavelength interval.

Although the principle of the present invention has been described above in the preferred embodiments with reference to the drawings, it is recognized by a skilled person that the arrangements and details in the present invention are changeable without departing from the principle. The present invention is not to be limited to the specific configurations disclosed in the embodiments. Therefore, all modifications and changes that may occur within the scope of the claims and the spirit thereof are to be included as claimed patent rights.

What is claimed is:

1. A semiconductor laser comprising:
   a semiconductor substrate having a principal surface;
   a first reflective region; and
   a second reflective region disposed opposite to the first reflective region, in a predetermined direction of an optical axis, such that no optical gain is provided along the optical axis other than by the first reflective region and the second reflective region,
   wherein the first reflective region has a plurality of gain waveguides each including an active layer generating light and a plurality of refractive-index controlling waveguides each having a first diffraction grating formed therein, the active layers and the first diffraction gratings being arranged alternately and periodically on the principal surface in the direction of the optical axis, and the first diffraction gratings being formed in only the refractive-index controlling waveguides and not in the gain waveguides, and
   wherein the second reflective region has a second diffraction grating.

2. The semiconductor laser according to claim 1, wherein the first reflective region has a plurality of reflectivity peak wavelengths that periodically vary at a first wavelength interval, and the second reflective region has a plurality of reflectivity peak wavelengths that periodically vary at a second wavelength interval different from the first wavelength interval.

3. The semiconductor laser according to claim 1, wherein the first diffraction gratings respectively formed in the refractive-index controlling waveguides are the same and have a fixed period in the direction of the optical axis.

4. The semiconductor laser according to claim 1, wherein the first reflective region further has:
a gain electrode for injecting current into the gain waveguides, and
a refractive-index controlling electrode for injecting current into the refractive-index controlling waveguides independently of the gain waveguides.

5. The semiconductor laser according to claim 4, wherein the first reflective region further has:
a gain wiring pattern that interconnects the gain waveguides, and
a refractive-index-controlling wiring pattern that interconnects the refractive-index controlling waveguides.

6. The semiconductor laser according to claim 1, wherein the second diffraction grating formed in the second reflective region includes a super-structure grating.

7. The semiconductor laser according to claim 6, wherein the super-structure grating in the second reflective region has a plurality of unit structures periodically disposed in the direction of the optical axis, the unit structure including a chirped diffraction grating.

8. The semiconductor laser according to claim 1, wherein the second reflective region further has:
a refractive-index controlling layer, and
an electrode for injecting current into the refractive-index controlling layer,
wherein the second diffraction grating is provided along the refractive-index controlling layer.

9. The semiconductor laser according to claim 1, wherein a band gap wavelength of the refractive-index controlling waveguides is shorter than a band gap wavelength of the gain waveguides.

10. The semiconductor laser according to claim 1, wherein any one of the first diffraction gratings respectively formed in the refractive-index controlling waveguides includes a phase shift region.

11. The semiconductor laser according to claim 1, wherein a coupling coefficient of each first diffraction grating is greater than a coupling coefficient of the second diffraction grating.

12. The semiconductor laser according to claim 1, further comprising:
a phase control region provided between the first reflective region and the second reflective region.

13. The semiconductor laser according to claim 12, wherein the phase control region further has:
an optical waveguide; and
an electrode for injecting current into the optical waveguide,
wherein the optical waveguide is not provided with a diffraction grating.

14. The semiconductor laser according to claim 1, wherein the first and second reflective regions are disposed in contact with each other in the predetermined direction of the optical axis.

15. The semiconductor laser according to claim 1, wherein the gain waveguide is separated from an edge of the diffraction grating in the refractive-index controlling waveguide with a predetermined distance.

* * * * *